(12) United States Patent
Kondo et al.

(10) Patent No.: US 8,956,007 B2
(45) Date of Patent: Feb. 17, 2015

(54) ENCAPSULATING SHEET, PRODUCING METHOD THEREOF, LIGHT EMITTING DIODE DEVICE, AND PRODUCING METHOD THEREOF

(75) Inventors: Takashi Kondo, Osaka (JP); Hirokazu Matsuda, Osaka (JP); Hiroki Kono, Osaka (JP)

(73) Assignee: Nitto Denko Corporation, Osaka (JP)

( * ) Notice: Subject to any disclaimer, the term of this patent is extended or adjusted under 35 U.S.C. 154(b) by 164 days.

(21) Appl. No.: 13/610,160

(22) Filed: Sep. 11, 2012

(65) Prior Publication Data

US 2013/0063939 A1 Mar. 14, 2013

(30) Foreign Application Priority Data

Sep. 14, 2011 (JP) ................. 2011-200579

(51) Int. Cl.
| | |
|---|---|
| F21V 5/00 | (2006.01) |
| H05B 33/00 | (2006.01) |
| H01L 33/52 | (2010.01) |
| H01L 25/075 | (2006.01) |
| H01L 33/50 | (2010.01) |
| H01L 33/56 | (2010.01) |

(52) U.S. Cl.
CPC ............. *H01L 33/52* (2013.01); *H01L 25/0753* (2013.01); *H01L 33/507* (2013.01); *H01L 33/56* (2013.01); *H01L 2933/005* (2013.01); *H01L 2933/0091* (2013.01); *H01L 2924/0002* (2013.01)
USPC .......................................... 362/235; 313/512

(58) Field of Classification Search
USPC .................. 257/89, 98; 313/512; 362/235
See application file for complete search history.

(56) References Cited

U.S. PATENT DOCUMENTS

| | | |
|---|---|---|
| 2009/0194774 A1 | 8/2009 | Huang et al. |
| 2011/0006316 A1 | 1/2011 | Ing et al. |

FOREIGN PATENT DOCUMENTS

| | | |
|---|---|---|
| EP | 2 535 955 A2 | 12/2012 |
| JP | 2007-67204 A | 3/2007 |

OTHER PUBLICATIONS

European Search Report issued in corresponding EP Application No. 12184062.3, dated Oct. 21, 2013.

*Primary Examiner* — Joseph L Williams
(74) *Attorney, Agent, or Firm* — Sughrue Mion, PLLC

(57) ABSTRACT

An encapsulating sheet includes an encapsulating layer for encapsulating a light emitting diode element, a light scattering layer formed at one side in a thickness direction of the encapsulating layer and for scattering light emitted from the light emitting diode element, and a spacer layer interposed between the encapsulating layer and the light scattering layer.

20 Claims, 14 Drawing Sheets

1

FIG. 2
(a)
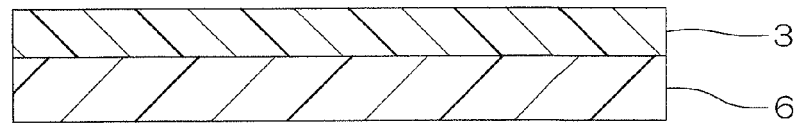
(b)
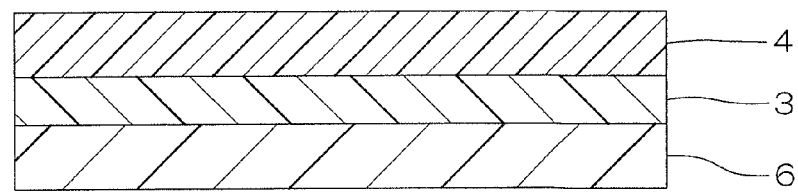
(c)
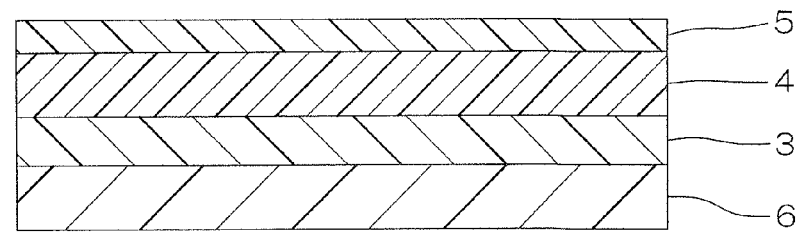
(d)
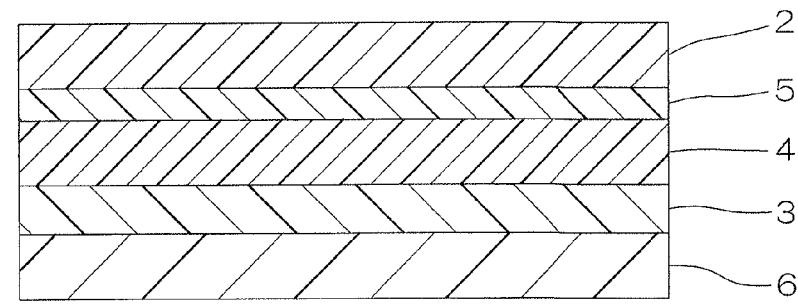

FIG. 3
(a)
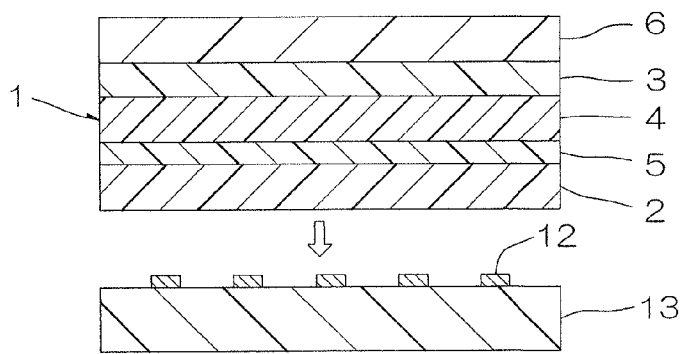
(b)
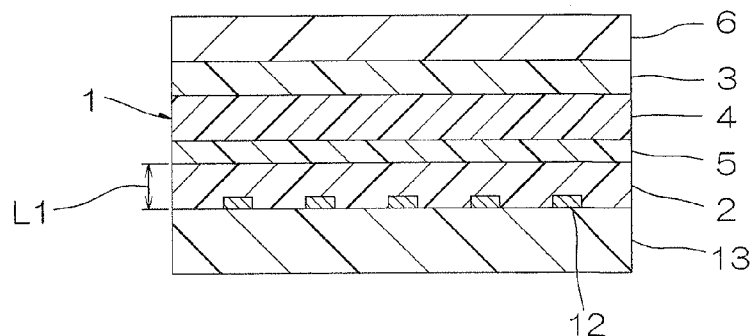
(c)
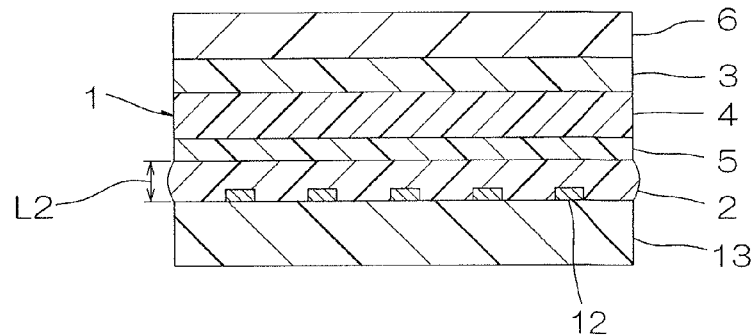
(d)
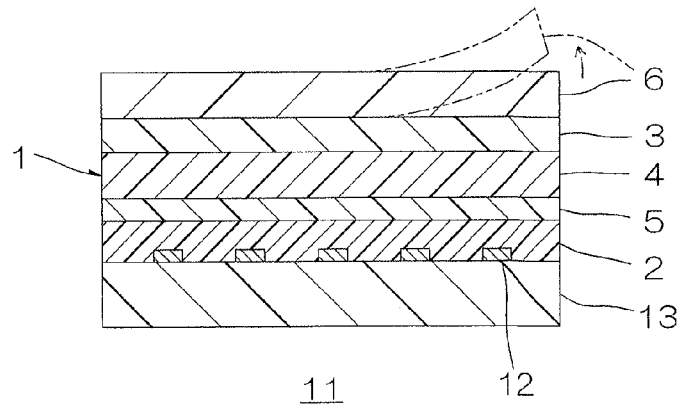

FIG. 4
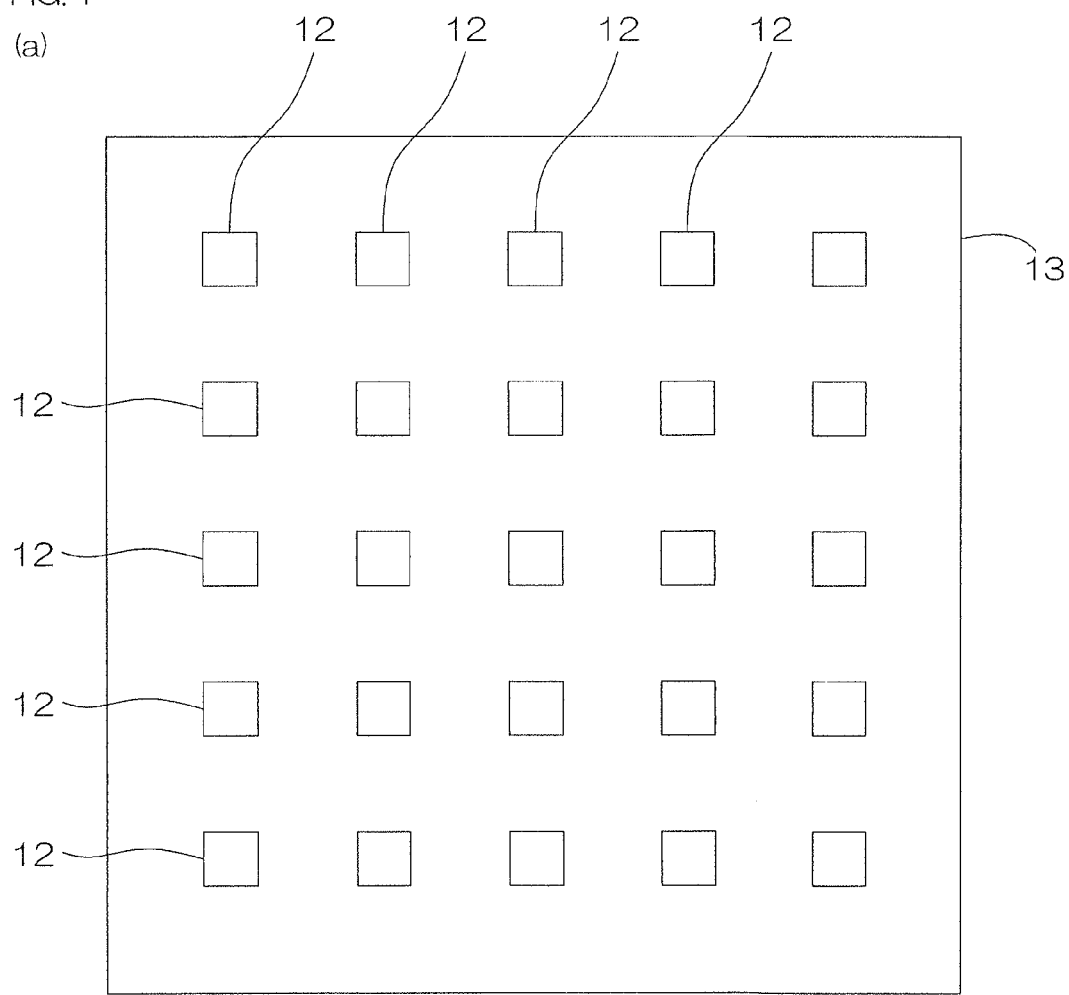
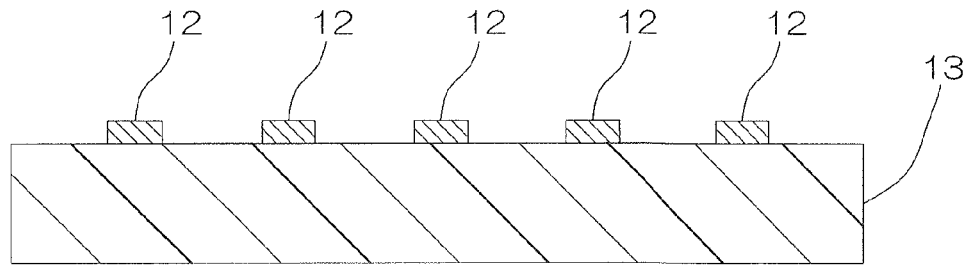

FIG.6 (Comparative Example 1)

FIG.7 (Comparative Example 2 and 3)

FIG.8 (Comparative Example 4~7)

Example 1

Example 2

Example 3

Example 4

Example 5

Comparative Example 1

Comparative Example 2

Comparative Example 3

Comparative Example 4

Comparative Example 5

Comparative Example 6

Comparative Example 7

ENCAPSULATING SHEET, PRODUCING METHOD THEREOF, LIGHT EMITTING DIODE DEVICE, AND PRODUCING METHOD THEREOF

CROSS-REFERENCE TO RELATED APPLICATION

The present application claims priority from Japanese Patent Application No. 2011-200579 filed on Sep. 14, 2011, the contents of which are hereby incorporated by reference into this application.

BACKGROUND OF THE INVENTION

1. Field of the Invention

The present invention relates to an encapsulating sheet, a producing method thereof, a light emitting diode device, and a producing method thereof, to be specific, to a light emitting diode device used for optical use, a producing method thereof, an encapsulating sheet used therein, and a producing method thereof.

2. Description of Related Art

In a light emitting diode device capable of emitting high-energy light, for example, an LED (a light emitting diode element) and an encapsulating layer which encapsulates the LED are provided. In the light emitting diode device, light emitted from the LED transmits through the encapsulating layer.

The LED emits light with high directivity, so that the LED serves as a point light source. That is, a difference in brightness between an immediate upper portion of the LED and a portion around the immediate upper portion thereof becomes greater. Then, color unevenness of the light occurs in the light emitting diode device.

To suppress the occurrence of the color unevenness, for example, a light emitting diode device which includes a light emitting diode chip, a transparent layer encapsulating the light emitting diode chip, and a light scattering layer formed on the upper surface of the transparent layer has been proposed (ref: for example, Japanese Unexamined Patent Publication No. 2007-67204).

The light emitting diode device in Japanese Unexamined Patent Publication No. 2007-67204 is obtained in such a way that the light emitting diode chip is encapsulated by the transparent layer and then, the light scattering layer is disposed on the upper surface of the transparent layer so as to include the light emitting diode chip when projected in the up-down direction.

In the light emitting diode device in Japanese Unexamined Patent Publication No. 2007-67204, after light emitted from the light emitting diode chip upwardly transmits through the transparent layer, the light is scattered in the light scattering layer along the plane direction thereof. Therefore, the light emitting diode chip serves as a surface light source in the light emitting diode device. That is, in the light scattering layer, a difference in brightness between an immediate upper portion of the light emitting diode chip and a portion around the immediate upper portion thereof is reduced. Then, the occurrence of the color unevenness of the light in the light emitting diode device is suppressed.

SUMMARY OF THE INVENTION

In recent years, in a light emitting diode device, the occurrence of the color unevenness is required to be further effectively suppressed by further surely allowing the light emitting diode element to serve as a surface light source.

On the other hand, in the method for producing a light emitting diode device in Japanese Unexamined Patent Publication No. 2007-67204, there is a disadvantage that the light emitting diode chip is encapsulated by the transparent layer and thereafter, the light scattering layer is disposed on the upper surface of the transparent layer, so that the number of production steps is large to become complicated and the production efficiency is low.

It is an object of the present invention to provide a producing method of a light emitting diode device in which a light emitting diode device can be easily and efficiently produced, a light emitting diode device which is obtained by the method and can surely allow a light emitting diode element to serve as a surface light source, an encapsulating sheet used therein, and a producing method thereof.

An encapsulating sheet of the present invention includes an encapsulating layer for encapsulating a light emitting diode element, a light scattering layer formed at one side in a thickness direction of the encapsulating layer and for scattering light emitted from the light emitting diode element, and a spacer layer interposed between the encapsulating layer and the light scattering layer.

In the encapsulating sheet of the present invention, it is preferable that the thickness of the spacer layer is 0.5 mm or more.

In the encapsulating sheet of the present invention, it is preferable that the thickness of the spacer layer is 1 mm or more.

In the encapsulating sheet of the present invention, it is preferable that the spacer layer is formed from a transparent resin.

In the encapsulating sheet of the present invention, it is preferable that the encapsulating layer is formed from a thermosetting resin in a B-stage state.

In the encapsulating sheet of the present invention, it is preferable that the light scattering layer is formed from a light scattering resin containing a silicone resin and a light reflecting component dispersed in the silicone resin.

In the encapsulating sheet of the present invention, it is preferable that the encapsulating sheet further includes a phosphor layer for converting a wavelength of the light emitted from the light emitting diode element.

In the encapsulating sheet of the present invention, it is preferable that the phosphor layer is interposed between the encapsulating layer and the spacer layer.

A method for producing an encapsulating sheet of the present invention includes the steps of forming a light scattering layer for scattering light emitted from a light emitting diode element, forming a spacer layer at one side in a thickness direction of the light scattering layer, and forming an encapsulating layer for encapsulating the light emitting diode element at one side in the thickness direction of the spacer layer.

A light emitting diode device of the present invention includes a board, a light emitting diode element mounted on the board, and the above-described encapsulating sheet formed on the board so as to encapsulate the light emitting diode element.

In the light emitting diode device of the present invention, it is preferable that a plurality of the light emitting diode elements are provided at spaced intervals to each other in a direction perpendicular to the thickness direction of the encapsulating sheet.

A method for producing a light emitting diode device of the present invention includes the steps of preparing a board mounted with a light emitting diode element and disposing the above-described encapsulating sheet at one side in a thickness direction of the board to encapsulate the light emitting diode element by the encapsulating layer.

In the method for producing an encapsulating sheet of the present invention and the encapsulating sheet of the present invention obtained by the method, the encapsulating layer, the spacer layer, and the light scattering layer are included. In the method for producing a light emitting diode device of the present invention, an easy method in which after preparing the board mounted with the light emitting diode element, the above-described encapsulating sheet is disposed on the board to encapsulate the light emitting diode element by the encapsulating layer is used, so that the putting of the encapsulating layer and the putting of the light scattering layer with respect to the board can be performed at the same time. In this way, the light emitting diode device of the present invention can be efficiently produced.

In the method for producing an encapsulating sheet of the present invention and the encapsulating sheet of the present invention obtained by the method, the spacer layer is interposed between the encapsulating layer and the light scattering layer, so that a space in the thickness direction between the encapsulating layer and the light scattering layer can be surely ensured.

Therefore, in the light emitting diode device of the present invention in which the encapsulating sheet is disposed and the light emitting diode element is encapsulated by the encapsulating layer, the light emitted from the light emitting diode element transmits through the encapsulating layer and the spacer layer to then reach the light scattering layer broadly. Thereafter, the light is scattered in a direction perpendicular to the thickness direction in the light scattering layer.

As a result, in the light emitting diode device, the light emitting diode element can be surely allowed to serve as a surface light source. That is, a difference in brightness between an immediate upper portion of the light emitting diode element and a portion around the immediate upper portion thereof can be reduced. Therefore, the occurrence of the color unevenness of the light in the light emitting diode device can be suppressed.

BRIEF DESCRIPTION OF THE DRAWINGS

FIG. 2 shows process drawings for illustrating a method for producing the encapsulating sheet shown in FIG. 1:
(a) illustrating a step of forming a light scattering layer,
(b) illustrating a step of forming a spacer layer,
(c) illustrating a step of forming a phosphor layer, and
(d) illustrating a step of forming an encapsulating layer.

FIG. 3 shows process drawings for illustrating a method for encapsulating a light emitting diode element using the encapsulating sheet shown in FIG. 1:
(a) illustrating a step of preparing a board mounted with the light emitting diode element,
(b) illustrating a step of embedding the light emitting diode element by the encapsulating sheet,
(c) illustrating a step of compressively bonding the encapsulating sheet to the board, and
(d) illustrating a step of heating the encapsulating sheet to be cured.

FIG. 4 shows the board shown in FIG. 3(a):
(a) illustrating a plan view and
(b) illustrating a sectional view.

DETAILED DESCRIPTION OF THE INVENTION

Figure 1:
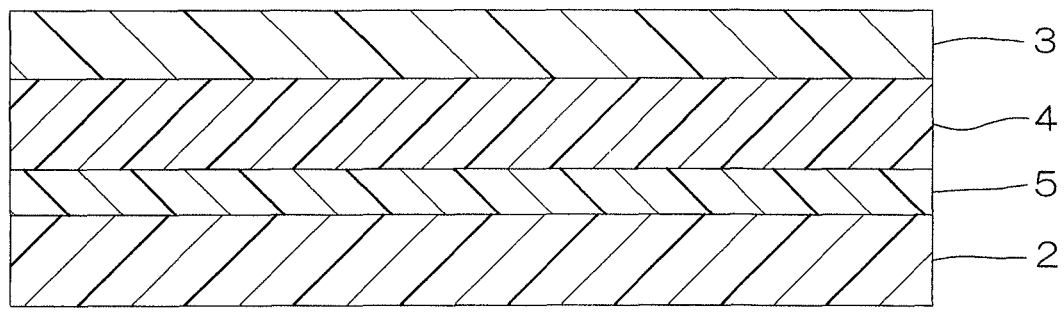
FIG. 1 shows a sectional view of one embodiment of an encapsulating sheet of the present invention.

FIG. 1 shows a sectional view of one embodiment of an encapsulating sheet of the present invention. FIG. 2 shows process drawings for illustrating a method for producing the encapsulating sheet shown in FIG. 1. FIG. 3 shows process drawings for illustrating a method for encapsulating a light emitting diode element using the encapsulating sheet shown in FIG. 1. FIG. 4 shows the board shown in FIG. 3(a).

As referred in FIG. 3(d), an encapsulating sheet 1 shown in FIG. 1 is provided in a light emitting diode device 11 (described later). The encapsulating sheet 1 is a sheet for encapsulating light emitting diode elements 12 (described later, ref: FIG. 3) and is formed into a generally rectangular shape in plane view.

As shown in FIG. 1, the encapsulating sheet 1 includes an encapsulating layer 2, a light scattering layer 3 formed on (at one side in the thickness direction of) the encapsulating layer 2, and a spacer layer 4 interposed between the encapsulating layer 2 and the light scattering layer 3. The encapsulating sheet 1 further includes a phosphor layer 5 interposed between the encapsulating layer 2 and the spacer layer 4.

That is, the encapsulating sheet 1 is formed as a laminate sheet in which the phosphor layer 5, the spacer layer 4, and the light scattering layer 3 are sequentially laminated in an ascending order on the encapsulating layer 2.

The encapsulating layer 2 is formed into a generally rectangular sheet shape in plane view.

As an encapsulating material for forming the encapsulating layer 2, for example, a transparent resin is used and the transparent resin includes an elastomer. To be specific, an example thereof includes an encapsulating resin such as a thermosetting resin including a silicone resin and an epoxy resin and a thermoplastic resin including an acrylic resin. As a transparent resin, preferably, a thermosetting resin is used.

The thermosetting resin includes, for example, a thermosetting resin composition in a B-stage (semi-cured) state. Examples thereof include a thermosetting silicone resin composition and a thermosetting epoxy resin composition. Preferably, a thermosetting silicone resin composition is used.

Among all, as the thermosetting silicone resin composition, a thermosetting silicone which can react in two steps is used. To be specific, a thermosetting silicone resin composition which can be subjected to a condensation reaction and an addition reaction (to be specific, a hydrosilylation reaction) is used. To be more specific, a thermosetting silicone resin composition which can be subjected to a condensation reaction to be brought into a B-stage state (a semi-cured state) by heating and then, be subjected to an addition reaction to be brought into a cured (completely cured) state by further heating is used.

The thermosetting silicone resin composition contains, for example, a polysiloxane containing silanol groups at both ends, an alkenyl group-containing alkoxysilane, an epoxy group-containing alkoxysilane, and an organohydrogensiloxane. The polysiloxane containing silanol groups at both ends, the alkenyl group-containing alkoxysilane, and the epoxy group-containing alkoxysilane are condensation materials (materials subjected to the condensation reaction) and the alkenyl group-containing alkoxysilane and the organohydrogensiloxane are addition materials (materials subjected to the addition reaction).

The polysiloxane containing silanol groups at both ends is a silane compound which contains silanol groups (SiOH groups) at both ends of a molecule and to be specific, is represented by the following formula (1).

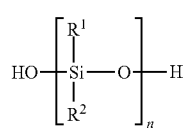

(1)

(where, in formula (1), $R^1$ and $R^2$ represent a monovalent hydrocarbon group and "n" represents an integer of 1 or more. $R^1$ and $R^2$ are the same or different from each other.)

In the above-described formula (1), preferably, $R^1$ and $R^2$ are the same.

The monovalent hydrocarbon group represented by $R^1$ and $R^2$ is saturated or unsaturated. An example thereof includes a straight chain, a branched chain, or a cyclic hydrocarbon group. The number of carbon atoms of the hydrocarbon group is, in view of easy preparation or thermal stability, for example, 1 to 20, or preferably 1 to 10.

To be specific, examples of the monovalent hydrocarbon group include a saturated aliphatic hydrocarbon group such as methyl, ethyl, propyl, isopropyl, butyl, isobutyl, pentyl, cyclopentyl, hexyl, and cyclohexyl and an aromatic hydrocarbon group such as phenyl and naphthyl.

As the monovalent hydrocarbon group, preferably, a saturated aliphatic hydrocarbon group and an aromatic hydrocarbon group are used, more preferably, methyl and phenyl are used, or particularly preferably, in view of transparency and light resistance, methyl is used.

In the above-described formula (1), "n" is preferably, in view of stability and/or handling ability, an integer of 1 to 10000, or more preferably an integer of 1 to 1000.

To be specific, examples of the polysiloxane containing silanol groups at both ends include a polydimethylsiloxane containing silanol groups at both ends, a polymethylphenylsiloxane containing silanol groups at both ends, and a polydiphenylsiloxane containing silanol groups at both ends. Preferably, a polydimethylsiloxane containing silanol groups at both ends is used.

A commercially available product can be used as the polysiloxane containing silanol groups at both ends. A polysiloxane containing silanol groups at both ends synthesized in accordance with a known method can be also used.

The polysiloxanes containing silanol groups at both ends can be used alone or in combination of two or more.

The polysiloxane containing silanol groups at both ends is a mixture of compounds in which "n"s are usually different from each other (that is, the molecular weights are different).

Accordingly, "n" in the above-described formula (1) is calculated as an average value.

The number average molecular weight of the polysiloxane containing silanol groups at both ends is, in view of stability and/or handling ability, for example, 100 to 1000000, or preferably 200 to 100000. The number average molecular weight is calculated by conversion based on standard polystyrene with a gel permeation chromatography. The number average molecular weight of materials, other than the polysiloxane containing silanol groups at both ends, to be described later, is also calculated in the same manner as in the description above.

The mixing ratio of the polysiloxane containing silanol groups at both ends with respect to the total amount of the condensation material is, for example, 1 to 99.99 mass %, preferably 50 to 99.9 mass %, or more preferably 80 to 99.5 mass %.

The alkenyl group-containing alkoxysilane is a silane compound which contains both an alkenyl group and an alkoxy group and to be specific, is an alkenyl group-containing trialkoxysilane represented by the following formula (2).

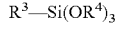

(2)

(where, in formula (2), $R^3$ is a straight chain or a cyclic alkenyl group and $R^4$ is a monovalent hydrocarbon group. $R^3$ and $R^4$ are different from each other.)

The number of carbon atoms of the alkenyl group represented by $R^3$ is, in view of easy preparation or thermal stability, for example, 1 to 20, or preferably 1 to 10.

To be specific, examples of the alkenyl group include a straight chain alkenyl group such as a vinyl group, an allyl group, a propenyl group, a butenyl group, a pentenyl group, a hexenyl group, a heptenyl group, and an octenyl group and a cyclic alkenyl group such as a norbornenyl group and a cyclohexenyl group.

Preferably, a straight chain alkenyl group is used, or more preferably, in view of reactivity in an addition reaction, a vinyl group is used.

An example of the monovalent hydrocarbon group represented by $R^4$ includes the same monovalent hydrocarbon group as that represented by $R^1$ and $R^2$ in the above-described formula (1). Preferably, methyl is used.

To be specific, examples of the alkenyl group-containing alkoxysilane include vinyltrialkoxysilane such as vinyltrimethoxysilane, vinyltriethoxysilane, and vinyltripropoxysilane; allyltrimethoxysilane; propenyltrimethoxysilane; butenyltrimethoxysilane; pentenyltrimethoxysilane; hexenyltrimethoxysilane; heptenyltrimethoxysilane; octenyltrimethoxysilane; norbornenyltrimethoxysilane; and cyclohexenyltrimethoxysilane.

Preferably, vinyltrialkoxysilane is used, or more preferably, vinyltrimethoxysilane is used.

The alkenyl group-containing alkoxysilanes can be used alone or in combination of two or more.

A commercially available product can be used as the alkenyl group-containing alkoxysilane. An alkenyl group-containing alkoxysilane synthesized in accordance with a known method can be also used.

The mixing ratio of the alkenyl group-containing trialkoxysilane with respect to the total amount of the condensation material is, for example, 0.01 to 90 mass %, preferably 0.01 to 50 mass %, or more preferably 0.01 to 10 mass %.

The epoxy group-containing alkoxysilane is a silane compound which contains both an epoxy group and an alkoxy group and to be specific, is an epoxy group-containing trialkoxysilane represented by the following formula (3).

$$R^5\text{—}Si(OR^6)_3 \quad (3)$$

(where, in formula (3), $R^5$ represents a glycidyl ether group and $R^6$ represents a monovalent hydrocarbon group.)

The glycidyl ether group represented by $R^5$ is a glycidoxyalkyl group represented by the following formula (4).

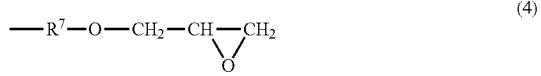

(4)

(where, in formula (4), $R^7$ represents a divalent hydrocarbon group.)

In the above-described formula (4), examples of the divalent hydrocarbon group represented by $R^7$ include an alkylene group having 1 to 6 carbon atoms such as methylene, ethylene, propylene, and butylene; a cycloalkylene group having 3 to 8 carbon atoms such as cyclohexylene; and an arylene group having 6 to 10 carbon atoms such as phenylene.

As the divalent hydrocarbon group, preferably, an alkylene group is used, or more preferably, propylene is used.

To be specific, examples of the glycidyl ether group represented by $R^5$ include glycidoxymethyl, glycidoxyethyl, glycidoxypropyl, glycidoxycyclohexyl, and glycidoxyphenyl.

In the above-described formula (3), an example of the monovalent hydrocarbon group represented by $R^6$ includes the same monovalent hydrocarbon group as that represented by $R^1$ and $R^2$ in the above-described formula (1). Preferably, methyl is used.

To be specific, examples of the epoxy group-containing alkoxysilane include glycidoxyalkyltrimethoxysilane such as glycidoxymethyltrimethoxysilane, (2-glycidoxyethyl)trimethoxysilane, and (3-glycidoxypropyl)trimethoxysilane; (3-glycidoxypropyl)triethoxysilane; (3-glycidoxypropyl)tripropoxysilane; and (3-glycidoxypropyl)triisopropoxysilane.

Preferably, glycidoxyalkyltrimethoxysilane is used, more preferably, glycidoxymethyltrialkoxysilane is used, or particularly preferably, (3-glycidoxypropyl)trimethoxysilane is used.

The epoxy group-containing alkoxysilanes can be used alone or in combination of two or more.

A commercially available product can be used as the epoxy group-containing alkoxysilane. An epoxy group-containing alkoxysilane synthesized in accordance with a known method can be also used.

The mixing ratio of the epoxy group-containing alkoxysilane with respect to the total amount of the condensation material is, for example, 0.01 to 90 mass %, preferably 0.01 to 50 mass %, or more preferably 0.01 to 20 mass %.

The molar ratio $(SiOH/(SiOR^4+SiOR^6))$ of the silanol group (SiOH group) in the polysiloxane containing silanol groups at both ends to the alkoxysilyl group ($SiOR^4$ group and $SiOR^6$ group) in the alkenyl group-containing alkoxysilane and the epoxy group-containing alkoxysilane is, for example, 20/1 to 0.2/1, preferably 10/1 to 0.5/1, or more preferably substantially 1/1.

When the molar ratio exceeds the above-described range, there may be a case where a product in a B-stage state (a semi-cured product) having an appropriate toughness is not obtained when the thermosetting silicone resin composition is brought into a B-stage (semi-cured) state. On the other hand, when the molar ratio is below the above-described range, the mixing proportion of the alkenyl group-containing alkoxysilane and the epoxy group-containing alkoxysilane is excessively large, so that the heat resistance of the encapsulating layer 2 to be obtained may be reduced.

When the molar ratio is within the above-described range (preferably, substantially 1/1), the silanol group (the SiOH group) in the polysiloxane containing silanol groups at both ends, and the alkoxysilyl group (the $SiOR^4$ group) in the alkenyl group-containing alkoxysilane and the alkoxysilyl group (the $SiOR^6$ group) in the epoxy group-containing alkoxysilane can be subjected to a condensation reaction neither too much nor too little.

The molar ratio of the alkenyl group-containing alkoxysilane to the epoxy group-containing alkoxysilane is, for example, 10/90 to 99/1, preferably 50/50 to 97/3, or more preferably 80/20 to 95/5. When the molar ratio is within the above-described range, there is an advantage that the adhesiveness of the cured product can be improved, while the strength thereof is ensured.

The organohydrogensiloxane is a compound which contains a hydrogen atom directly bonded to a silicon atom in the main chain. Examples of the organohydrogensiloxane include a hydride compound represented by the following formula (5) and containing a hydrogen atom directly bonded to a silicon atom in the middle (between the both ends) of the main chain or a hydride compound (a polysiloxane containing hydrosilyl groups at both ends) represented by the following formula (6) and containing hydrogen atoms directly bonded to silicon atoms at both ends of the main chain.

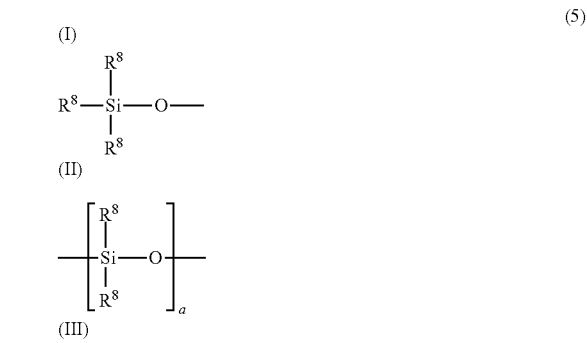

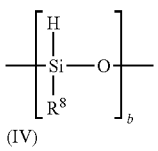

(IV)

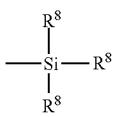

(where, in formula (5), I to IV represent a constituent unit, I and IV represent an end unit, and II and III represent a repeating unit. $R^8$s are the same or different from each other and represent monovalent hydrocarbon groups. "a" represents an integer of 0 or more and "b" represents an integer of 2 or more.)

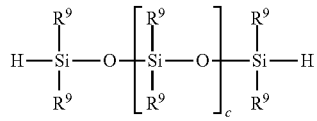

(6)

(where, in formula (6), $R^9$s are the same or different from each other and represent monovalent hydrocarbon groups. "c" represents an integer of 0 or more.)

Preferably, $R^8$s in the constituent units I to IV are the same.

An example of the monovalent hydrocarbon group represented by $R^8$ includes the same monovalent hydrocarbon group as that represented by the above-described $R^1$ and $R^2$. Preferably, a saturated aliphatic hydrocarbon group and an aromatic hydrocarbon group are used, more preferably, methyl and phenyl are used, or particularly preferably, methyl is used.

The constituent units I and IV are the constituent units of both ends of the structure.

"a" in the constituent unit II is the number of repeating units of the constituent unit II and represents, in view of reactivity, preferably an integer of 1 to 1000, or more preferably an integer of 1 to 100.

"b" in the constituent unit III is the number of repeating units of the constituent unit III and represents, in view of reactivity, preferably an integer of 2 to 10000, or more preferably an integer of 2 to 1000.

To be specific, examples of the hydride compound represented by the above-described formula (5) include methylhydrogenpolysiloxane, dimethylpolysiloxane-co-methylhydrogenpolysiloxane, ethylhydrogenpolysiloxane, and methylhydrogenpolysiloxane-co-methylphenylpolysiloxane. Preferably, dimethylpolysiloxane-co-methylhydrogenpolysiloxane is used.

The hydride compounds represented by the above-described formula (5) can be used alone or in combination of two or more.

The hydride compound represented by the above-described formula (5) is a mixture of compounds in which "a" and/or "b" are usually different from each other (that is, the molecular weights are different).

Accordingly, "a" in the constituent unit II and "b" in the constituent unit III are respectively calculated as an average value.

The number average molecular weight of the hydride compound represented by the above-described formula (5) is, for example, 100 to 1000000.

Preferably, $R^9$s in the above-described formula (6) are the same. That is, all of the $R^9$s bonded to the silicon atoms at both ends and the $R^9$s bonded to the silicon atom between both ends are the same.

An example of the monovalent hydrocarbon group represented by $R^9$ includes the same monovalent hydrocarbon group as that represented by the above-described $R^1$ and $R^2$. Preferably, a saturated aliphatic hydrocarbon group and an aromatic hydrocarbon group are used, or more preferably, methyl and phenyl are used.

In the above-described formula (6), "c" represents, in view of reactivity, preferably an integer of 1 to 10000, or more preferably an integer of 1 to 1000.

To be specific, examples of the hydride compound represented by the above-described formula (6) include a polydimethylsiloxane containing hydrosilyl groups at both ends, a polymethylphenylsiloxane containing hydrosilyl groups at both ends, and a polydiphenylsiloxane containing hydrosilyl groups at both ends.

The hydride compounds represented by the above-described formula (6) can be used alone or in combination of two or more.

The hydride compound represented by the above-described formula (6) is a mixture of compounds in which "c"s are usually different from each other (that is, the molecular weights are different).

Accordingly, "c" in the above-described formula (6) is calculated as an average value.

The number average molecular weight of the hydride compound represented by the above-described formula (6) is, in view of stability and/or handling ability, for example, 100 to 1000000, or preferably 100 to 100000.

The viscosity of the organohydrogensiloxane at 25° C. is, for example, 10 to 100000 mPa·s, or preferably 15 to 50000 mPa·s. The viscosity is measured with a B-type viscometer.

A commercially available product can be used as the organohydrogensiloxane. An organohydrogensiloxane synthesized in accordance with a known method can be also used.

As the organohydrogensiloxane, the hydride compound represented by the above-described formula (5) or the hydride compound represented by the above-described formula (6) can be used alone. Alternatively, the hydride compound represented by the above-described formula (5) and the hydride compound represented by the above-described formula (6) can be used in combination. As the organohydrogensiloxane, preferably, the hydride compound represented by the above-described formula (5) is used alone.

The mixing ratio of the organohydrogensiloxane with respect to 100 parts by mass of the alkenyl group-containing alkoxysilane is, though depending on the molar ratio of the alkenyl group ($R^3$ in the above-described formula (2)) in the alkenyl group-containing alkoxysilane to the hydrosilyl group (the SiH group) in the organohydrogensiloxane, for example, 10 to 10000 parts by mass, or preferably 100 to 1000 parts by mass.

The molar ratio ($R^3$/SiH) of the alkenyl group ($R^3$ in the above-described formula (2)) in the alkenyl group-containing alkoxysilane to the hydrosilyl group (the SiH group) in the organohydrogensiloxane is, for example, 20/1 to 0.05/1, preferably 20/1 to 0.1/1, more preferably 10/1 to 0.1/1, particularly preferably 10/1 to 0.2/1, or most preferably 5/1 to 0.2/1.

When the molar ratio exceeds the above-described range, there may be a case where a semi-cured product having an appropriate toughness is not obtained when the thermosetting silicone resin composition is brought into a B-stage state. On the other hand, when the molar ratio is below the above-described range, the mixing proportion of the organohydrogensiloxane is excessively large, so that the heat resistance and the toughness of the phosphor layer 5 to be obtained may be insufficient.

When the molar ratio is within the above-described range, in allowing the thermosetting silicone resin composition to be brought into a B-stage state, the thermosetting silicone resin composition can be quickly transferred into a B-stage state.

The above-described polysiloxane containing silanol groups at both ends, alkenyl group-containing alkoxysilane, epoxy group-containing alkoxysilane, and organohydrogensiloxane are blended with a catalyst to be stirred and mixed, so that the thermosetting silicone resin composition is prepared.

Examples of the catalyst include a condensation catalyst and an addition catalyst (a hydrosilylation catalyst).

The condensation catalyst is not particularly limited as long as it is a substance capable of improving the reaction rate of the condensation reaction of the silanol group with the alkoxysilyl group. Examples of the condensation catalyst include an acid such as hydrochloric acid, acetic acid, formic acid, and sulfuric acid; a base such as potassium hydroxide, sodium hydroxide, potassium carbonate, and tetramethylammonium hydroxide; and a metal catalyst such as aluminum, titanium, zinc, and tin.

Of these, in view of compatibility and thermal decomposition characteristics, preferably, a base is used, or more preferably, tetramethylammonium hydroxide is used.

The mixing ratio of the condensation catalyst with respect to 100 mol of the polysiloxane containing silanol groups at both ends is, for example, 0.1 to 50 mol, or preferably 0.25 to 5 mol.

The addition catalyst is not particularly limited as long as it is a substance capable of improving the reaction rate of the addition reaction, that is, the hydrosilylation reaction of the alkenyl group with the SiH. Examples of the addition catalyst include a metal catalyst such as a platinum catalyst including platinum black, platinum chloride, chloroplatinic acid, a platinum olefin complex, a platinum carbonyl complex, and platinum acetyl acetate; a palladium catalyst; and a rhodium catalyst.

Of these, in view of compatibility, transparency, and catalyst activity, preferably, a platinum catalyst is used, or more preferably, a platinum carbonyl complex is used.

The mixing ratio of the addition catalyst with respect to 100 parts by mass of the organohydrogensiloxane is, as the number of parts by mass of the metal amount in the addition catalyst, for example, $1.0 \times 10^{-4}$ to 1.0 parts by mass, preferably $1.0 \times 10^{-4}$ to 0.5 parts by mass, or more preferably $1.0 \times 10^{-4}$ to 0.05 parts by mass.

As the above-described catalyst, a catalyst in a solid state can be used as it is. Alternatively, in view of handling ability, a catalyst dissolved or dispersed in a solvent can be used as a solution or a dispersion liquid.

Examples of the solvent include water and an alcohol such as methanol and ethanol. Preferably, an alcohol is used.

To prepare the thermosetting silicone resin composition, for example, the above-described materials (the condensation materials and the addition materials) and the catalysts are added simultaneously. Alternatively, first, each of the materials and each of the catalysts can be added, respectively, at different timings. In addition, a part of the components can be added simultaneously and each of the remaining components can be added, respectively, at different timings.

Preferably, first, the condensation materials and the condensation catalyst are added simultaneously. Next, the addition materials are added thereto and then, the addition catalyst is added thereto.

To be specific, the polysiloxane containing silanol groups at both ends, the alkenyl group-containing alkoxysilane, and the epoxy group-containing alkoxysilane (that is, the condensation materials) are blended with the condensation catalyst at the above-described proportion to be stirred for, for example, 5 minutes to 24 hours.

At the time of blending and stirring, the temperature can be also adjusted to, for example, 0 to 60° C. so as to improve the compatibility and the handling ability of the condensation materials.

At the time of blending of the materials and the condensation catalyst, a compatibilizing agent for improving the compatibility thereof can be added at an appropriate proportion.

An example of the compatibilizing agent includes an organic solvent such as an alcohol including methanol. When the condensation catalyst is prepared as a solution or a dispersion liquid of an organic solvent, the organic solvent can serve as the compatibilizing agent.

Thereafter, the pressure in the system (the above-described mixture) is reduced as required, so that a volatile component (the organic solvent) is removed.

Next, the organohydrogensiloxane is blended into the obtained mixture of the condensation materials and the condensation catalyst to be stirred for, for example, 1 to 60 minutes.

At the time of blending and stirring, the temperature can be also adjusted to, for example, 0 to 60° C. so as to improve the compatibility and the handling ability of the mixture and the organohydrogensiloxane.

Thereafter, the addition catalyst is blended into the system (the above-described mixture) to be stirred for, for example, 1 to 60 minutes.

In this way, the thermosetting silicone resin composition can be prepared.

A light reflecting component and/or a phosphor can be included in the encapsulating material as required.

The light reflecting component is, for example, a white compound. To be specific, an example of the white compound includes a white pigment.

An example of the white pigment includes a white inorganic pigment. Examples of the white inorganic pigment include an oxide such as titanium oxide, zinc oxide, zirconium oxide, silicon oxide (to be specific, silicon dioxide, silica), aluminum oxide (alumina), and talc; a carbonate such as white lead (lead carbonate) and calcium carbonate; nitride such as aluminum nitride; and a clay mineral such as kaolin (kaolinite).

As the white inorganic pigment, preferably, an oxide is used, or more preferably, silica is used.

Examples of the silica include a fused silica powder and a crystalline silica powder. Preferably, a fused silica powder (that is, a silica glass powder) is used.

The light reflecting component is in the form of a particle. The shape thereof is not limited and examples of the shape thereof include a sphere shape, a plate shape, and a needle shape. Preferably, a sphere shape is used.

The average value of the maximum length (in a case of the sphere shape, the average particle size) of the light reflecting component is, for example, 1 to 60 μm, or preferably 2 to 45 μm. The average value of the maximum length is measured by using a laser diffraction scattering particle size analyzer. The average value of the maximum length of the following particle is measured in the same manner as in the description above.

The mixing ratio of the light reflecting component with respect to 100 parts by mass of the transparent resin is, for example, 0.5 to 90 parts by mass, or preferably, in view of coloring characteristics, light reflectivity, and handling ability of the transparent resin, 1.5 to 70 parts by mass.

The above-described light reflecting component is uniformly dispersed in the transparent resin.

The phosphor is described in details in the phosphor layer 5 to be described later and is uniformly dispersed in the transparent resin. The mixing ratio of the phosphor with respect to 100 parts by mass of the transparent resin is, for example, 0.5 to 90 parts by mass, or preferably 1.5 to 70 parts by mass.

When the light reflecting component and/or the phosphor are blended in the encapsulating material, the thermosetting silicone resin composition is blended with the light reflecting component and/or the phosphor.

The compressive elastic modulus of the encapsulating layer 2 (the encapsulating layer 2 in a B-stage state) at 25° C. is, for example, 0.2 to 1 MPa. The compressive elastic modulus is measured with, for example, a load measuring device (a precision load measuring device 1605 II VL, manufactured by AIKOH ENGINEERING CO., LTD.).

The thickness L1 (ref: FIG. 3($b$)) of the encapsulating layer 2 is adjusted so that the light emitting diode elements 12 can be embedded therein. To be specific, the thickness L1 of the encapsulating layer 2 is, for example, 300 to 3000 μm, or preferably 500 to 2000 μm.

As shown in FIG. 1, the phosphor layer 5 is formed on the entire upper surface of the encapsulating layer 2.

The phosphor layer 5 contains a phosphor and an example of the phosphor includes a yellow phosphor which is capable of converting blue light into yellow light. An example of the phosphor includes a phosphor obtained by doping a metal atom such as cerium (Ce) or europium (Eu) into a composite metal oxide, a metal sulfide, or the like.

To be specific, examples of the phosphor include a garnet type phosphor having a garnet type crystal structure such as $Y_3Al_5O_{12}$:Ce (YAG (yttrium aluminum garnet):Ce), $(Y, Gd)_3Al_5O_{12}$:Ce, $Tb_3Al_3O_{12}$:Ce, $Ca_3Sc_2Si_3O_{12}$:Ce, and $Lu_2CaMg_2(Si, Ge)_3O_{12}$:Ce; a silicate phosphor such as $(Sr, Ba)_2SiO_4$ (BOS (barium orthosilicate)):Eu, $Ca_3SiO_4Cl_2$:Eu, $Sr_3SiO_5$:Eu, $Li_2SrSiO_4$:Eu, and $Ca_3Si_2O_7$:Eu; an aluminate phosphor such as $CaAl_{12}O_{19}$:Mn and $SrAl_2O_4$:Eu; a sulfide phosphor such as ZnS:Cu,Al, CaS:Eu, $CaGa_2S_4$:Eu, and $SrGa_2S_4$:Eu; an oxynitride phosphor such as $CaSi_2O_2N_2$:Eu, $SrSi_2O_2N_2$:Eu, $BaSi_2O_2N_2$:Eu, and Ca-α-SiAlON; a nitride phosphor such as $CaAlSiN_3$:Eu and $CaSi_5N_8$:Eu; and a fluoride-based phosphor such as $K_2SiF_6$:Mn and $K_2TiF_6$:Mn. Preferably, in view of conversion characteristics of converting blue light to yellow light, a garnet type phosphor is used, or more preferably, in view of conversion efficiency, YAG:Ce and BOS:Eu are used.

The phosphors can be used alone or in combination of two or more.

The phosphor is in the form of a particle. The shape thereof is not particularly limited and examples of the shape thereof include a sphere shape, a flat plate shape, and a needle shape.

The average value of the maximum length (in a case of the sphere shape, the average particle size) of the phospohr is, for example, 0.1 to 500 μm, or preferably 0.2 to 200 μm. The average particle size of the phosphor particle is measured with a particle size distribution analyzer.

The phosphor layer 5 is formed from a phosphor containing resin in which the above-described phosphor is blended in a resin.

An example of the resin includes the same transparent resin as that used in the encapsulating layer 2 described above. Preferably, a thermosetting resin composition is used, or more preferably, a thermosetting silicone resin composition is used. Preferably, an example of the resin includes a thermosetting resin in a C-stage (completely cured) state.

To prepare the phosphor containing resin composition, the above-described phosphor and resin (preferably, the thermosetting resin) are blended to be stirred and mixed. To be specific, the phosphor and the resin are blended to be mixed, so that the phosphor is uniformly dispersed in the resin.

The mixing proportion of the phosphor is appropriately adjusted in accordance with quantum efficiency and scattering properties of the phosphor and is adjusted so as to have a predetermined color tone such as white. To be specific, the mixing ratio of the phosphor with respect to the phosphor containing resin composition is, for example, 1 to 50 mass %, or for example, 10 to 40 mass %.

The stirring temperature is, for example, room temperature (about 25° C.) to 50° C. and the stirring duration is, for example, 1 minute to 180 minutes.

In this way, the phosphor containing resin composition is prepared.

Alternatively, the phosphor layer 5 can be formed from, for example, a ceramic of the phosphor as a phosphor ceramic plate.

The thickness of the phosphor layer 5 is, for example, 50 to 1000 μm, or preferably 50 to 500 μm.

The spacer layer 4 is formed on the entire upper surface of the phosphor layer 5.

The spacer layer 4 is formed from, for example, a transparent resin. An example of the transparent resin includes the same transparent resin as that for forming the encapsulating layer 2. Preferably, a transparent resin which does not contain a light reflecting component is used, or particularly preferably, a thermosetting silicone resin composition is used.

The thickness of the spacer layer 4 is, for example, 0.5 mm or more, preferably 1 mm or more, or more preferably 1.2 mm or more, and is, for example, 5 mm or less, preferably 4 mm or less, or more preferably 3 mm or less.

When the thickness of the spacer layer 4 is below the above-described lower limit, in a case where the space between the light emitting diode elements 12 to be described later (ref: FIG. 4) is large (to be specific, 5 mm or more), light emitted from the light emitting diode elements 12 does not sufficiently expand in the spacer layer 4, so that the light emitting diode elements 12 may not serve as a surface light source in the light scattering layer 3 to be described next.

On the other hand, when the thickness of the spacer layer 4 exceeds the above-described upper limit, the spacer layer 4 may not be easily formed by the application or the like.

When the thickness of the spacer layer 4 is 500 μm, the light transmittance of the spacer layer 4 with respect to the light in the wavelength of 440 to 600 nm is, for example, 80% or more, preferably 85% or more, or more preferably 90% or more, and is, for example, 100% or less.

The refractive index of the spacer layer 4 with respect to the light in the wavelength of 555 nm is, for example, above 1, preferably 1.3 or more, or more preferably 1.35 or more, and is, for example, 1.45 or less.

The light scattering layer 3 is formed on the entire upper surface of the spacer layer 4.

The light scattering layer 3 is formed from, for example, a light scattering resin composition which contains a transparent resin and a light reflecting component.

An example the transparent resin includes the same transparent resin as that in the description above. In view of long-term reliability, preferably, a silicone resin is used, or more preferably, a thermosetting silicone resin composition in a C-stage state is used.

The light reflecting component is dispersed in the transparent resin (preferably, the thermosetting silicone resin composition). An example of the light reflecting component includes the same light reflecting component as that capable of being blended in the encapsulating material described above.

The average value of the maximum length (in a case of the sphere shape, the average particle size) of the light reflecting component is, for example, 1 μm or more, preferably 2 μm or more, and is, for example, 60 μm or less, preferably 40 μm or less, or more preferably 20 μm or less.

When the average value of the maximum length of the light reflecting component is below the above-described lower limit, Rayleigh scattering of the light occurs in the light scattering layer 3, so that back scattering may increase.

When the average value of the maximum length of the light reflecting component exceeds the above-described upper limit, a reflection (an interfacial reflection) at the interface between the light reflecting component (a particle constituting the light reflecting component) and the transparent resin becomes large, so that back scattering may increase.

The mixing ratio of the light reflecting component with respect to the light scattering resin composition is, for example, 3 mass % or more, or preferably 5 mass % or more, and is, for example, 50 mass % or less. The mixing ratio of the light reflecting component with respect to 100 parts by mass of the transparent resin is, for example, 3 to 90 parts by mass, or preferably 10 to 60 parts by mass.

The thickness of the light scattering layer 3 is, for example, 50 to 2000 μm, or preferably 100 to 1000 μm.

Next, the method for producing the encapsulating sheet 1 is described with reference to FIG. 2.

In this method, first, as shown in FIG. 2(*a*), the light scattering layer 3 is formed.

To form the light scattering layer 3, for example, a transparent resin is blended with the light reflecting component and a solvent is further blended therein at an appropriate proportion as required. In this way, the light scattering resin composition is prepared.

Thereafter, the prepared light scattering resin composition is, for example, applied on a release film (a saparator film) 6 to form a film made of the light scattering resin composition. Then, the film is heated. In this way, the light scattering layer 3 made from the light scattering resin in a C-stage (completely cured) state is formed.

The heating temperature is, for example, 80 to 150° C., or preferably 100 to 120° C. and the heating duration is, for example, 3 to 300 minutes, or preferably 5 to 60 minutes.

Alternatively, a light scattering film which is molded into a film shape in advance can serve as a light scattering layer. A commercially available product can be used as the light scattering film. To be specific, for example, Light-Up series (manufactured by KIMOTO CO., LTD.) or the like is used.

When the light scattering film serves as the light scattering layer, the light scattering film, as it is, is prepared as the light scattering layer in a film shape without using the release film (the saparator film) 6.

Next, in this method, as shown in FIG. 2(*b*), the spacer layer 4 is formed on (at one side in the thickness direction of) the light scattering layer 3.

To be specific, a transparent resin is blended with a solvent as required to prepare a transparent resin composition.

The prepared transparent resin composition is applied to the entire upper surface of the light scattering layer 3 to form a film made of the transparent resin composition. Thereafter, the film is heated. The heating temperature is, for example, 80 to 130° C., or preferably 90 to 100° C. The heating duration is, for example, 3 to 300 minutes, or preferably 5 to 60 minutes.

In this way, the spacer layer 4 made from the transparent resin in a C-stage (completely cured) state is formed.

Next, in this method, as shown in FIG. 2(*c*), the phosphor layer 5 is formed on (at one side in the thickness direction of) the spacer layer 4.

To be specific, a resin is blended with a phosphor and a solvent is further blended therein at an appropriate proportion as required. In this way, a phosphor containing resin composition is prepared.

Thereafter, the prepared phosphor containing resin composition is applied to the entire upper surface of the spacer layer 4 to form a film made of the phosphor containing resin composition. Thereafter, the film is heated. The heating temperature is, for example, 80 to 130° C., or preferably 90 to 100° C. The heating duration is, for example, 3 to 300 minutes, or preferably 5 to 60 minutes.

In this way, the phosphor layer 5 made from the phosphor containing resin in a C-stage (completely cured) state is formed.

Alternatively, a phosphor ceramic plate is laminated on the spacer layer 4, so that the phosphor layer 5 can be formed.

Next, in this method, as shown in FIG. 2(*d*), the encapsulating layer 2 is formed on (at one side in the thickness direction of) the phosphor layer 5.

To be specific, an encapsulating resin composition which contains an encapsulating resin, and the light reflecting component and/or the phosphor is applied to the entire upper surface of the phosphor layer 5 to form a film made of the encapsulating resin composition. Thereafter, the film is heated. The heating temperature is, for example, 100 to 160° C., or preferably 110 to 155° C. The heating duration is, for example, 1 to 60 minutes, or preferably 3 to 10 minutes.

In this way, the encapsulating layer 2 made from the encapsulating resin composition in a B-stage (semi-cured) state is formed.

In this way, the encapsulating sheet 1 is obtained.

Next, the method for producing the light emitting diode device 11 by encapsulating the light emitting diode elements 12 using the encapsulating sheet 1 is described with reference to FIGS. 3 and 4.

In this method, as shown in FIGS. 4(*a*) and 4(*b*), a board 13 mounted with the light emitting diode elements 12 is prepared.

The board 13 is formed into a flat plate shape. The board 13 is, on the upper surface thereof, provided with a terminal (not shown) for being electrically connected to the light emitting diode elements 12 and a wire (not shown) to be continuous thereto.

The light emitting diode elements 12 are, on (at one side in the thickness direction of) the board 13, disposed in alignment at spaced intervals to each other in the plane direction (a direction perpendicular to the thickness direction). Each of the light emitting diode elements 12 is formed into a generally rectangular shape in plane view. The light emitting diode elements 12 are mounted on the board 13 by a wire bonding, a flip-chip bonding, or the like.

The space between the light emitting diode elements 12 is, for example, 0.1 to 100 mm, or preferably 1 to 10 mm. The maximum length in the plane direction of the light emitting diode element 12 (the size of the light emitting diode element 12) is, for example, 1 to 5 mm, or preferably 1 to 2 mm. The minimum length in the plane direction of the light emitting diode element 12 is, for example, 0.1 to 1 mm, or preferably 0.2 to 1.5 mm.

The board 13 is mounted with a plurality of the light emitting diode elements 12, so that the board 13 serves as a multi-board.

Next, in this method, as shown in FIG. 3(a), the encapsulating sheet 1 is disposed adjacent to the upper side (one side in the thickness direction) of the board 13.

To be specific, the encapsulating sheet 1 shown in FIG. 2(d) is reversed upside down and then, as shown by an arrow in FIG. 3(a), and FIGS. 3(b) and 3(c), the light emitting diode elements 12 are embedded by the encapsulating sheet 1. To be specific, the reversed encapsulating sheet 1 is disposed on the board 13 so that the light emitting diode elements 12, the terminal, and the wire are embedded in the encapsulating layer 2.

To be specific, as shown in FIG. 3(b), the encapsulating sheet 1 is lowered (pressed downwardly) and the surfaces of the light emitting diode elements 12 are covered with the encapsulating layer 2. Subsequently, as shown in FIG. 3(c), the encapsulating sheet 1 is compressively bonded to the board 13.

The compressive bonding is performed by controlling the amount (hereinafter, defined as a pushed-in amount) in which the encapsulating layer 2 is pushed into (compressed into) the board 13 side.

The pushed-in amount is represented by the following formula.

Pushed-in amount=Thickness $L1$ of the encapsulating layer 2 before the compression (the compressive bonding)−Thickness $L2$ of the encapsulating layer 2 after the compression (the compressive bonding)

The pushed-in amount is adjusted so that the pushed-in rate represented by the following formula is set to be, for example, 3 to 30%.

Pushed-in rate=Pushed-in amount/Thickness $L1$ of the encapsulating layer 2 before the compression (the compressive bonding)×100%

To be specific, the encapsulating sheet 1 is compressively bonded so that the thickness of the encapsulating layer 2 is compressed by the pushed-in amount.

By adjusting the pushed-in amount in this way, a collapse of the encapsulating layer 2 is prevented, so that the light emitting diode elements 12 can be surely encapsulated by the encapsulating layer 2.

The temperature of the compressive bonding is, for example, 0 to 40° C., or preferably 15 to 35° C.

In the compressive bonding, the encapsulating sheet 1 can be retained in a state where it is pressed downwardly (pushed in) and the retention duration thereof is, for example, 10 seconds to 10 minutes, or preferably 10 second to 5 minutes.

Thereafter, as shown in FIG. 3(d), the encapsulating layer 2 is heated, so that the encapsulating resin composition is cured.

The heating temperature is, for example, 100 to 160° C., or preferably 120 to 155° C. The heating duration is, for example, 10 to 600 minutes, or preferably 60 to 450 minutes.

In this way, the light emitting diode elements 12 are encapsulated by the encapsulating layer 2 in a C-stage (completely cured) state.

Thereafter, as shown in phantom lines in FIG. 3(d), the release film 6 is peeled from the light scattering layer 3 as required.

In this way, as shown in FIG. 3(d), the light emitting diode device 11 including the board 13, the light emitting diode elements 12, and the encapsulating sheet 1 can be produced.

A plurality of the light emitting diode elements (chips) 12 mounted on the board 13, which serves as a multi-board, are encapsulated by the encapsulating layer 2, so that the light emitting diode device 11 serves as a multi-chip module.

The encapsulating sheet 1 obtained by the above-described method includes the encapsulating layer 2, the spacer layer 4, and the light scattering layer 3. In the above-described method for producing the light emitting diode device 11, an easy method in which after preparing the board 13 mounted with the light emitting diode elements 12, the encapsulating sheet 1 is disposed on the board 13 to encapsulate the light emitting diode elements 12 by the encapsulating layer 2 is used, so that the putting of the encapsulating layer 2 and the putting of the light scattering layer 3 with respect to the board 13 can be performed at the same time. In this way, the light emitting diode device 11 can be efficiently produced.

In the encapsulating sheet 1, the spacer layer 4 is interposed between the encapsulating layer 2 and the light scattering layer 3, so that a space in the thickness direction between the encapsulating layer 2 and the light scattering layer 3 can be surely ensured.

Therefore, in the light emitting diode device 11 in which the encapsulating sheet 1 is disposed and the light emitting diode elements 12 are encapsulated by the encapsulating layer 2, the light emitted from the light emitting diode elements 12 transmits through the encapsulating layer 2 and the spacer layer 4 to then reach the light scattering layer 3 broadly. Thereafter, the light is scattered in the plane direction in the light scattering layer 3.

As a result, in the light emitting diode device 11, the light emitting diode elements 12 can be surely allowed to serve as a surface light source. That is, a difference in brightness between the immediate upper portions of the light emitting diode elements 12 and a portion around the immediate upper portions thereof can be reduced.

To be specific, the brightness uniformity (described in details in Examples later) in the light emitting diode device 11 in which a plurality of the light emitting diode elements 12 mounted on the board 13 at regular intervals in alignment are encapsulated by the encapsulating sheet 1 is, for example, 70% or more, preferably 75% or more, more preferably 90% or more, or particularly preferably 95% or more, and is, for example, 100% or less.

Therefore, the occurrence of the color unevenness of the light in the light emitting diode device 11 can be suppressed.

Figure 5:
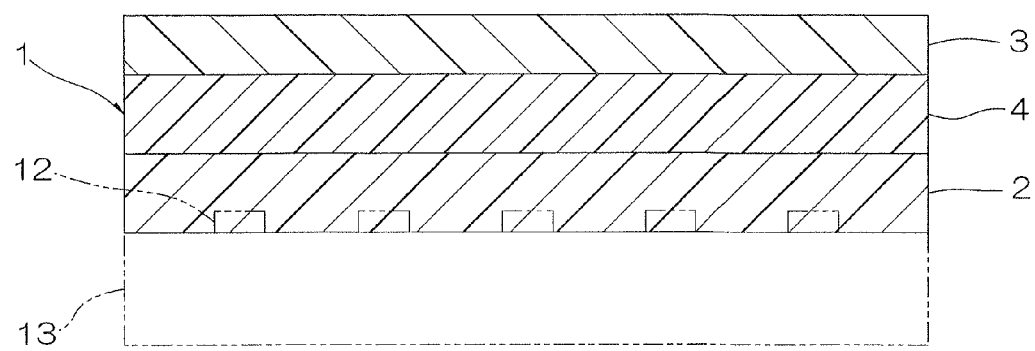
FIG. 5 shows a sectional view of another embodiment (an embodiment in which the phosphor layer is not included, and the encapsulating layer and the spacer layer are in contact with each other) of the encapsulating sheet of the present invention.

FIG. 5 shows a sectional view of another embodiment (an embodiment in which the phosphor layer is not included, and the encapsulating layer and the spacer layer are in contact with each other) of the encapsulating sheet of the present invention.

In each figure to be described below, the same reference numerals are provided for members corresponding to each of those described above, and their detailed description is omitted.

In the embodiment in FIG. 1, the phosphor layer 5 is interposed between the encapsulating layer 2 and the spacer layer 4. Alternatively, for example, as shown in FIG. 5, the encapsulating layer 2 and the spacer layer 4 can be provided so as to be in contact with each other without providing the phosphor layer 5.

In FIG. 5, the encapsulating sheet 1 includes the encapsulating layer 2, the light scattering layer 3 formed at the upper side of the encapsulating layer 2, and the spacer layer 4 interposed between the encapsulating layer 2 and the light scattering layer 3. That is, the encapsulating sheet 1 is formed as a laminate sheet in which the spacer layer 4 and the light scattering layer 3 are sequentially laminated in an ascending order on the encapsulating layer 2.

The spacer layer 4 is formed on the entire upper surface of the encapsulating layer 2.

The encapsulating sheet 1 shown in FIG. 5 can have the same function and effect as that of the encapsulating sheet 1 shown in FIG. 1 described above.

Preferably, as shown in FIG. 1, in the encapsulating sheet 1, the phosphor layer 5 is provided so as to be interposed between the encapsulating layer 2 and the spacer layer 4.

As referred in FIG. 3(d), in the encapsulating sheet 1 shown in FIG. 1, a wavelength of the light emitted from the light emitting diode elements 12 can be converted by the phosphor layer 5. To be specific, blue light which is contained in the light emitted from the light emitting diode elements 12 can be partially converted to yellow light by the phosphor layer 5. Therefore, the light emitting diode device 11 can emit high-energy white light by color mixing of the yellow light and the blue light which transmits through the phosphor layer 5 and is not converted to the yellow light.

In the embodiments in FIGS. 1 and 3(d), the phosphor layer 5 is interposed between the encapsulating layer 2 and the spacer layer 4. However, the arrangement thereof is not particularly limited. Although not shown, for example, the phosphor layer 5 can be interposed between the spacer layer 4 and the light scattering layer 3. Alternatively, the phosphor layer 5 can be also provided on the entire upper surface of the light scattering layer 3.

Preferably, as shown in the embodiments in FIGS. 1 and 3(d), the phosphor layer 5 is interposed between the encapsulating layer 2 and the spacer layer 4.

In this way, the light which is emitted from the light emitting diode elements 12 and subsequently, transmits through the encapsulating layer 2 and in which the wavelength is partially converted by the phosphor layer 5, as mixed light (white light) of the yellow light and the blue light, transmits through the spacer layer 4 to reach the light scattering layer 3 broadly. Then, the high-energy white light is scattered in the plane direction in the light scattering layer 3, so that the light emitting diode elements 12 can be allowed to serve as a high-energy surface light source.

On the other hand, in the encapsulating sheet 1 in FIG. 5, a phosphor is contained in the encapsulating layer 2, so that the encapsulating layer 2 can serve as an encapsulating phosphor layer 2.

That is, the phosphor is contained in the encapsulating resin which forms the encapsulating phosphor layer 2, so that the phosphor is dispersed in the encapsulating resin.

This embodiment can have the same function and effect (the light emission of the high-energy white light) as that of the encapsulating sheet 1 in FIG. 1.

In the light emitting diode device 11 in FIG. 3(d), a plurality of the light emitting diode elements 12 are mounted on the board 13. Alternatively, for example, though not shown, one piece of the light emitting diode element 12 can be mounted on the board 13.

In such a case, the same function and effect as that of the encapsulating sheet 1 in FIG. 1 can be obtained.

Preferably, as shown in FIG. 3(d), in the light emitting diode device 11, a plurality of the light emitting diode elements 12 are mounted on the board 13.

In this way, a difference in brightness between the immediate upper portions of the light emitting diode elements 12 and the portion around the immediate upper portions thereof (including a portion between the light emitting diode elements 12) can be reduced, while the amount of emitted light can increase by a plurality of the light emitting diode elements 12, so that the occurrence of the color unevenness of the light in the light emitting diode device 11 can be suppressed.

EXAMPLES

While the present invention will be described hereinafter in further detail with reference to Examples and Comparative Examples, the present invention is not limited to these Examples and Comparative Examples.

Example 1

(1) Formation of Light Scattering Layer 5 g of silicon dioxide (FB-3SDC, in a sphere shape, an average particle size of 3.4 μm, manufactured by DENKI KAGAKU KOGYO KABUSHIKI KAISHA.) was added to 5 g of a silicone elastomer (ELASTOSIL LR-7665, manufactured by WACKER ASAHIKASEI SILICONE CO., LTD.) to be uniformly dispersed by hand stirring, so that a light scattering resin composition in a liquid state was prepared. Thereafter, the prepared light scattering resin composition was subjected to a defoaming process and subsequently, the defoamed product was applied on a separator film (SS4C) so as to have a thickness of 500 μm using an applicator. Thereafter, the obtained film was cured by heating at 100° C. for 10 minutes, so that a light scattering layer made from a light scattering resin in a C-stage (completely cured) state was formed (ref: FIG. 2(a)).

(2) Formation of Spacer Layer

A thermosetting silicone resin composition made from the defoamed silicone elastomer (ELASTOSIL LR-7665, manufactured by WACKER ASAHIKASEI SILICONE CO., LTD.) was applied on the entire upper surface of the light scattering layer formed in the above-described (1) so as to have a thickness of 1 mm. Thereafter, the obtained film was cured by heating at 100° C. for 10 minutes, so that a spacer layer made from a transparent resin in a C-stage (completely cured) state was formed (ref: FIG. 2(b)).

(3) Formation of Phosphor Layer 26 g of YAG:Ce was added to 74 g of the silicone elastomer (ELASTOSIL LR-7665, manufactured by WACKER ASAHIKASEI SILICONE CO., LTD.) to be uniformly dispersed by hand stirring, so that a phosphor containing resin composition in a liquid state was prepared. Thereafter, the prepared phosphor containing resin composition was subjected to a defoaming process and subsequently, the defoamed product was applied to the entire upper surface of the spacer layer so as to have a thickness of 100 μm. Thereafter, the obtained film was cured by heating at 100° C. for 10 minutes, so that a phosphor layer made from a phosphor containing resin in a C-stage (completely cured) state was formed (ref: FIG. 2(c)).

(4) Formation of Encapsulating Layer and Fabrication of Encapsulating Sheet 15.76 g (0.106 mol) of vinyltrimethoxysilane (an alkenyl group-containing alkoxysilane) and 2.80 g (0.0118 mol) of (3-glycidoxypropyl)trimethoxysilane (an epoxy group-containing alkoxysilane) were blended in 2031 g (0.177 mol) of a polydimethylsiloxane containing silanol groups at both ends (a polysiloxane containing silanol groups at both ends, in formula (1), all of the $R^1$s and $R^2$s are methyl, an average of "n" is 155, a number average molecular weight of 11500) which was heated at 40° C. to be stirred and mixed.

The molar ratio (the number of moles in SiOH group/the number of moles in $SiOCH_3$ group) of the SiOH group in the polydimethylsiloxane containing silanol groups at both ends to the SiOCH$_3$ group in the vinyltrimethoxysilane and the (3-glycidoxypropyl)trimethoxysilane was 1/1.

After the stirring and mixing, 0.97 mL (0.766 g, the content of the catalyst: 0.88 mmol, corresponding to 0.50 mol with respect to 100 mol of the polydimethylsiloxane containing silanole groups at both ends) of a methanol solution (a condensation catalyst, a concentration of 10 mass %) of the tetramethylammonium hydroxide was added thereto to be stirred at 40° C. for 1 hour. The obtained mixture (oil) was stirred under reduced pressure (10 mmHg) at 40° C. for 1 hour and volatile components (methanol or the like) were removed.

Thereafter, the pressure of the system was brought back to the normal pressure and then, 44.67 g (0.319 mol) of an organohydrogensiloxane (where, in formula (5), all of the R$^8$s are methyl, the average of "a" is 10, the average of "b" is 10; the viscosity at 25° C. is 20 mPa·s) was added to the reactant to be stirred at 40° C. for 1 hour.

The molar ratio (CH$_2$═CH—/SiH) of the vinyl group (CH$_2$═CH—) in the vinyltrimethoxysilane to the hydrosilyl group (the SiH group) in the organohydrogensiloxane was 1/3.

Thereafter, 0.13 g (0.13 mL, the content of the platinum of 2 mass %, as a platinum corresponding to 1.2×10$^{-4}$ parts by mass with respect to 100 parts by mass of the organohydrogensiloxane) of a solution of a platinum carbonyl complex (an addition catalyst, a platinum concentration of 2 mass %) was added to the system to be stirred at 40° C. for 10 minutes.

In this way, a thermosetting silicone resin composition was prepared.

Thereafter, 50 g of the prepared thermosetting silicone resin composition was blended with 50 g of the silicon dioxide (FB-40S, in a sphere shape, an average particle size of 40 μm, manufactured by DENKI KAGAKU KOGYO KABUSHIKI KAISHA.) to be uniformly dispersed, so that a mixture in a liquid state was prepared. Thereafter, the mixture was subjected to a defoaming process and subsequently, the defoamed product was applied to the entire upper surface of the phosphor layer so as to have a thickness (L1) of 1 mm. Then, the obtained film was heated at 135° C. for 3 minutes to form an encapsulating layer made from an encapsulating resin composition containing silicon dioxide in a B-stage (semi-cured) state (ref: FIG. 2(d)). The compressive elastic modulus (at 25° C.) of the encapsulating layer was 0.1 MPa.

In this way, an encapsulating sheet in which the light scattering layer, the spacer layer, the phosphor layer, and the encapsulating layer were sequentially laminated on a release film was fabricated.

(5) Production of Light Emitting Diode Device

A board (a multi-board) mounted with a plurality (25 pieces: 5 pieces in a vertical row, 5 pieces in a horizontal row) of light emitting diode elements (chips) disposed in alignment at spaced intervals to each other was prepared (ref: FIGS. 3, 4(a), and 4(b)). Each of the light emitting diode elements was formed into a square shape in plane view having a side of 1 mm (that is, a size of 1 mm×1 mm). The space between the light emitting diode elements was 5 mm.

Next, the reversed encapsulating sheet was disposed on the board so that the light emitting diode elements were embedded in the encapsulating layer (ref: FIG. 3(a)).

To be specific, the encapsulating sheet in a state shown in FIG. 2(d) was reversed up-side down and the reversed encapsulating sheet was disposed so that the encapsulating layer was opposed to the light emitting diode elements at spaced intervals thereto in the up-down direction (ref: FIG. 3(a)).

Next, the light emitting diode elements were embedded by the encapsulating sheet at normal temperature (25° C.) (ref: FIGS. 3(b) and 3(c)).

To be specific, the encapsulating sheet was lowered and the surfaces of the light emitting diode elements were covered with the encapsulating layer (ref: FIG. 3(b)). Subsequently, the position of the encapsulating sheet was retained for 40 seconds in a state where the thickness of the encapsulating layer was controlled so as to be compressed by the pushed-in amount of 50 μm (pushed-in rate of 5%=pushed-in amount of 50 μm/thickness (L1) of the encapsulating layer before the compression (the compressive bonding) of 1000 μm×100%), so that the encapsulating sheet was compressively bonded to the board (ref: FIG. 3(c)).

After the compressive bonding, the thickness (L2) of the encapsulating layer was 950 μm.

Thereafter, the encapsulating layer was heated at 150° C. for 5 hours to be cured (ref: FIG. 3(d)).

In this way, the light emitting diode elements were encapsulated by the encapsulating layer in a C-stage (completely cured) state.

Thereafter, a saparator film (SS4C) was peeled from the light scattering layer (ref: phantom lines in FIG. 3(d)).

In this way, a light emitting diode device (a multi-chip module) was produced.

Example 2

A phosphor layer and an encapsulating layer were sequentially formed to form an encapsulating sheet and subsequently, a light emitting diode device was produced in the same manner as in Example 1, except that the thickness of a spacer layer was changed from 1 mm to 2 mm in (2) Formation of Spacer Layer.

Example 3

A phosphor layer and an encapsulating layer were sequentially formed to form an encapsulating sheet and subsequently, a light emitting diode device was produced in the same manner as in Example 1, except that the thickness of a spacer layer was changed from 1 mm to 3 mm in (2) Formation of Spacer Layer.

Example 4

A phosphor layer and an encapsulating layer were sequentially formed to form an encapsulating sheet and subsequently, a light emitting diode device was produced in the same manner as in Example 1, except that the thickness of a spacer layer was changed from 1 mm to 4 mm in (2) Formation of Spacer Layer.

Example 5

A spacer layer, a phosphor layer, and an encapsulating layer were sequentially formed to form an encapsulating sheet and subsequently, a light emitting diode device was produced in the same manner as in Example 1, except that a light scattering film (LIGHT-UP PBU, manufactured by KIMOTO CO., LTD.) having a thickness of 125 μm was provided as a light scattering layer in (1) Formation of Light Scattering Layer.

That is, the light scattering film was prepared as the light scattering layer without using a separator film (SS4C).

Comparative Example 1

Figure 6:
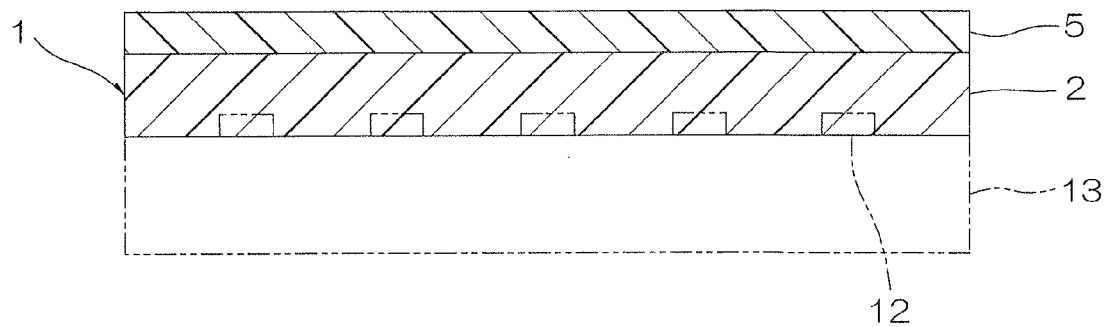
FIG. 6 shows a sectional view of the encapsulating sheet (an embodiment in which the light scattering layer and the spacer layer are not included) of Comparative Example 1.

A light emitting diode device was produced in the same manner as in Example 1, except that a light scattering layer and a spacer layer were not provided (ref: FIG. 6).

That is, as shown in FIG. 6, an encapsulating sheet 1 includes an encapsulating layer 2 and a phosphor layer 5 formed thereon.

Comparative Example 2

Figure 7:
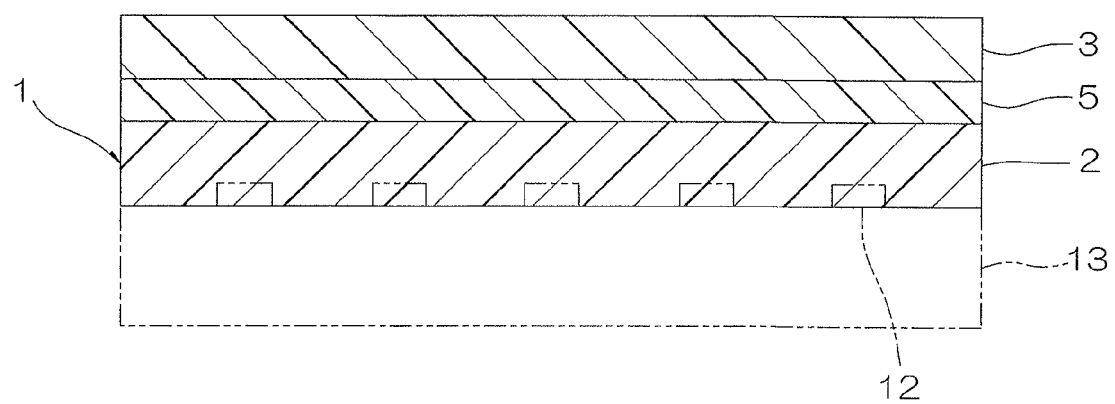
FIG. 7 shows a sectional view of the encapsulating sheet (an embodiment in which the spacer layer is not included) of Comparative Examples 2 and 3.

A light emitting diode device was produced in the same manner as in Example 1, except that a spacer layer was not provided (ref: FIG. 7).

That is, as shown in FIG. 7, the encapsulating sheet 1 includes the encapsulating layer 2, the phosphor layer 5 formed thereon, and a light scattering layer 3 formed on the phosphor layer 5.

Comparative Example 3

A light scattering film (LIGHT-UP PBU, manufactured by KIMOTO CO., LTD.) having a thickness of 125 μm was laminated on the phosphor layer 5 in a light emitting diode device 11 in Comparative Example 1 shown in FIG. 6 (ref: FIG. 7).

That is, as shown in FIG. 7, a light scattering film 3 was provided in the encapsulating sheet 1, shown in FIG. 6, in which light emitting diode elements 12 were already encapsulated.

Comparative Example 4

Figure 8:
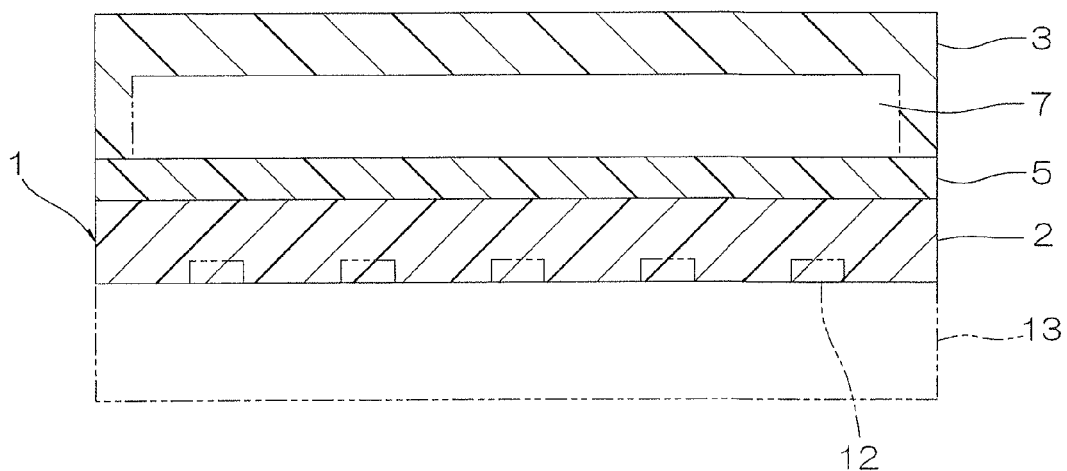
FIG. 8 shows a sectional view of the encapsulating sheet (an embodiment in which the spacer layer is not included and a space is defined in the light scattering layer) of Comparative Examples 4 to 7.
Figure 9:
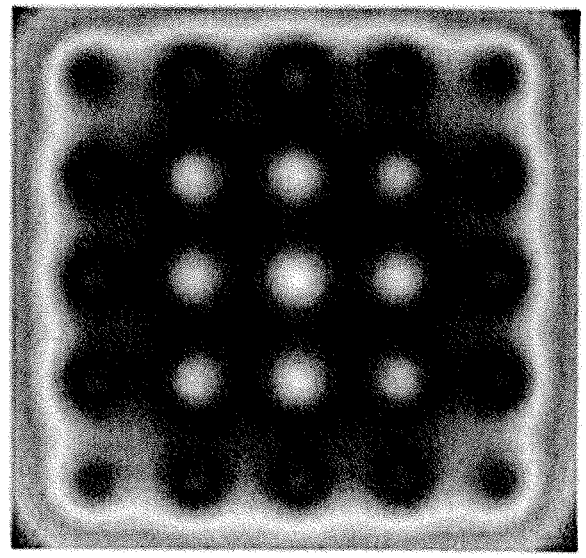
FIG. 9 shows an image processing view for photographing light emission of Example 1.
Figure 10:
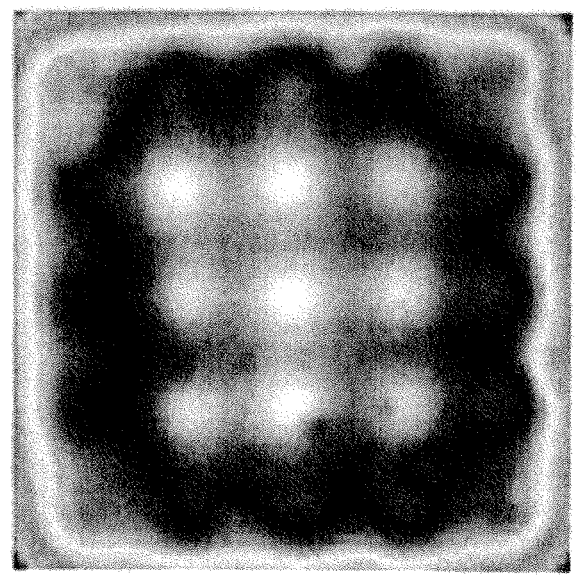
FIG. 10 shows an image processing view for photographing light emission of Example 2.
Figure 11:
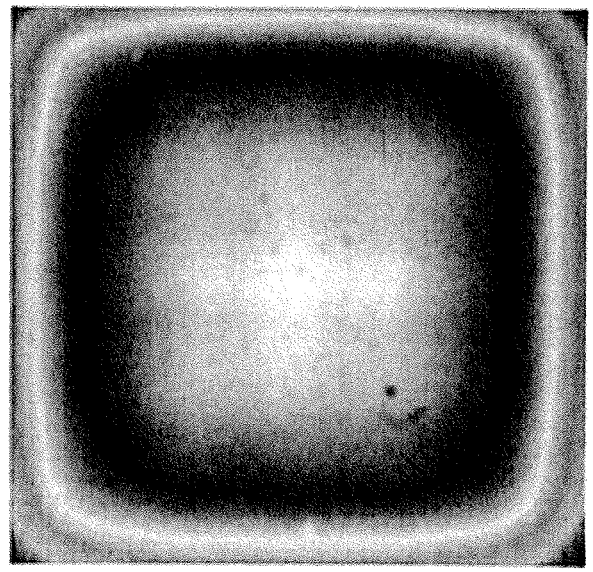
FIG. 11 shows an image processing view for photographing light emission of Example 3.
Figure 12:
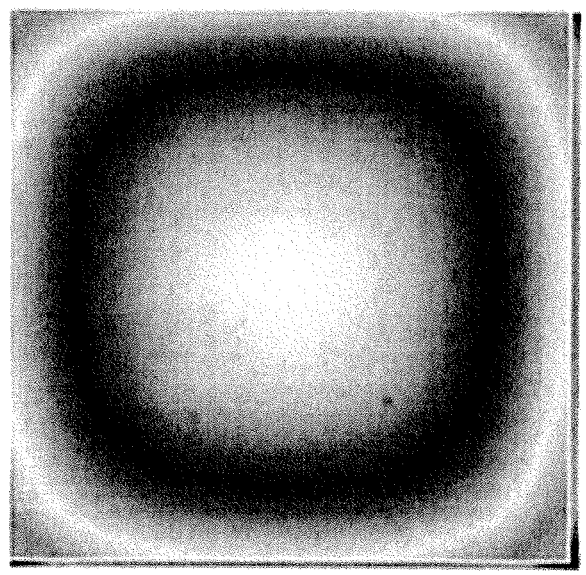
FIG. 12 shows an image processing view for photographing light emission of Example 4.
Figure 13:
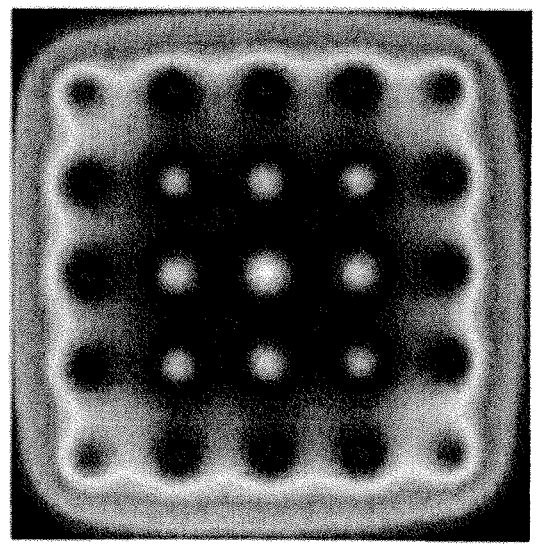
FIG. 13 shows an image processing view for photographing light emission of Example 5.

As referred in FIG. 8, first, circumference end portions of a light scattering film (LIGHT-UP PBU, manufactured by KIMOTO CO., LTD.) having a thickness of 125 μm were folded downwardly, so that a light scattering layer, which opened downwardly, in a U-shaped form in sectional view was formed. The light scattering layer was positioned so that the central portion thereof was opposed to the light emitting diode elements 12 in the light emitting diode device 11 in Comparative Example 1 shown in FIG. 6. Thereafter, the circumference end portions of the light scattering layer 3 were laminated on the circumference end portions of a board 13. In this way, a space 7 having a thickness (a space in the thickness direction) of 1 mm was defined at the lower side of the central portion of the light scattering layer 3 (ref: FIG. 8).

That is, the light scattering layer 3 in a U-shaped form in sectional view shown in FIG. 8 was provided in the encapsulating sheet 1, shown in FIG. 6, in which the light emitting diode elements 12 were already encapsulated.

Comparative Example 5

A light emitting diode device was produced in the same manner as in Example 1, except that the thickness of the space 7 was changed from 1 mm to 2 mm in the formation of the light scattering layer 3.

Comparative Example 6

A light emitting diode device was produced in the same manner as in Example 1, except that the thickness of the space 7 was changed from 1 mm to 3 mm in the formation of the light scattering layer 3.

Comparative Example 7

A light emitting diode device was produced in the same manner as in Example 1, except that the thickness of the space 7 was changed from 1 mm to 4 mm in the formation of the light scattering layer 3.

(Evaluation)
(1) Brightness Uniformity

The brightness uniformity of the light emitting diode device was evaluated with a luminance meter (manufactured by HI-LAND).

That is, a luminance measurement equipment was disposed in opposed relation to the upper side of the light emitting diode device to allow the light emitting diode elements to emit light. A difference in brightness between the immediate upper portions of the light emitting diode elements and the portion around the immediate upper portions thereof was evaluated as the brightness uniformity (%) which was calculated by the following formula.

Brightness uniformity (%)=(brightness of the portion around the immediate upper portion)/(brightness of the immediate upper portion) brightness uniformity (%)×100

The results are shown in Table 1.

TABLE 1

| | Spacer Layer | | | Brightness | Process |
|---|---|---|---|---|---|
| | Thickness (mm) | Type | Light Scattering Layer | Uniformity (%) | Properties |
| Ex. 1 | 1 | Transparent Resin | Light Scattering Resin | 75 | Good |
| Ex. 2 | 2 | Transparent Resin | Light Scattering Resin | 86 | Good |
| Ex. 3 | 3 | Transparent Resin | Light Scattering Resin | 94 | Good |
| Ex. 4 | 4 | Transparent Resin | Light Scattering Resin | 98 | Good |
| Ex. 5 | 1 | Transparent Resin | Light Scattering Film* | 71 | Good |
| Comp. Ex. 1 | — | — | — | 37 | — |
| Comp. Ex. 2 | — | — | Light Scattering Resin | 59 | Good |
| Comp. Ex. 3 | — | — | Light Scattering Film* | 53 | Bad |
| Comp. Ex. 4 | 1 | Space | Light Scattering Film* | 68 | Bad |
| Comp. Ex. 5 | 2 | Space | Light Scattering Film* | 80 | Bad |
| Comp. Ex. 6 | 3 | Space | Light Scattering Film* | 89 | Bad |
| Comp. Ex. 7 | 4 | Space | Light Scattering Film* | 96 | Bad |

* LIGHT-UP PBU100 manufactured by KIMOTO CO., LTD.

The larger value of the brightness uniformity shows that the degree of the uniformity is higher. The smaller value thereof shows that the degree of the uniformity is lower.

Light received by a camera provided in the luminance measurement equipment was photographed as an image. The images are shown in FIGS. 9 to 20.

(2) Convenience of Producing Method of Light Emitting Diode Device

The convenience of the steps for producing the light emitting diode device was evaluated based on the following reference.

Good: The encapsulation of the light emitting diode elements by the encapsulating layer and the putting of the light scattering layer corresponding to the light emitting diode elements could be performed at the same time.

Bad: After the light emitting diode elements were encapsulated by the encapsulating layer, the light scattering layer corresponding to the light emitting diode elements was put.

(Discussion)

In Examples 1 to 5, each of the evaluations of the brightness uniformity was excellent, which was 70% or more, and as shown in FIGS. 9 to 13, the light emitting diode elements served as a surface light source. In addition, the encapsulation of the light emitting diode elements by the encapsulating layer and the putting of the light scattering layer could be performed at the same time.

Figure 14:
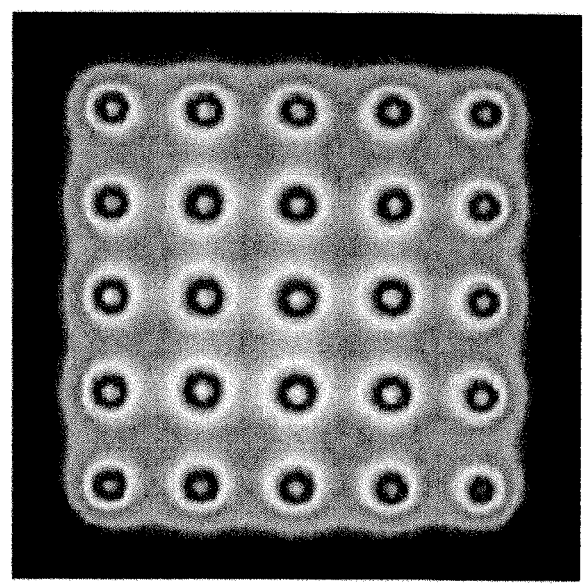
FIG. 14 shows an image processing view for photographing light emission of Comparative Example 1.

On the other hand, in Comparative Example 1, the light scattering layer was not provided, so that the evaluation of the brightness uniformity was defective, which was below 70%, and as shown in FIG. 14, the light emitting diode elements served as a point light source.

Figure 15:
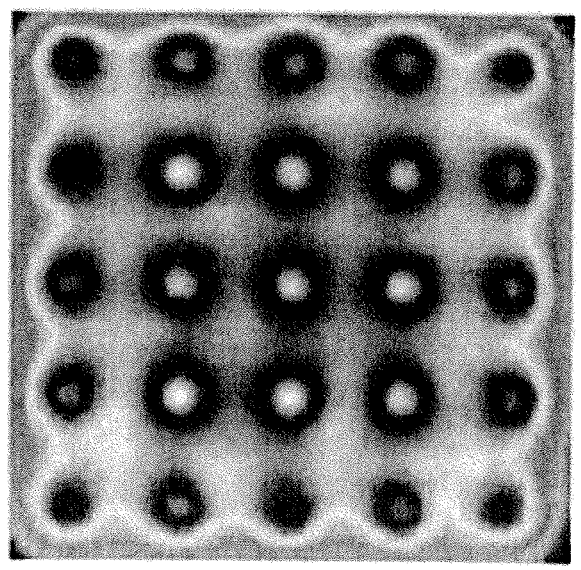
FIG. 15 shows an image processing view for photographing light emission of Comparative Example 2.
Figure 16:
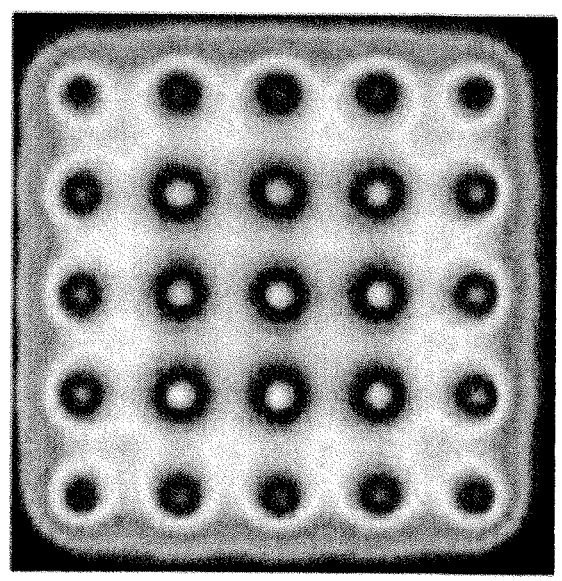
FIG. 16 shows an image processing view for photographing light emission of Comparative Example 3.
Figure 17:
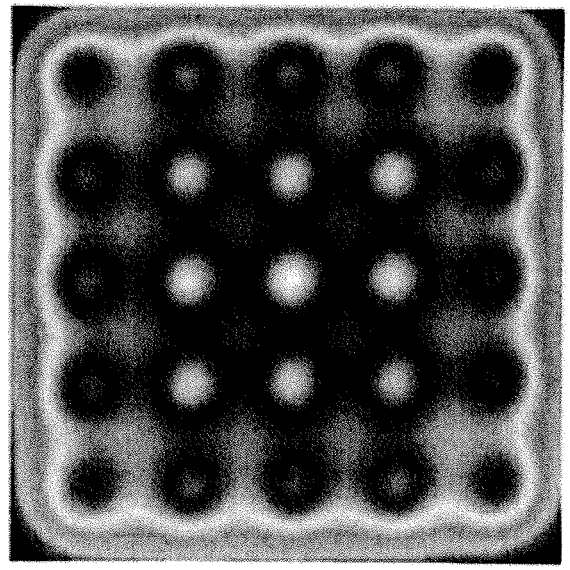
FIG. 17 shows an image processing view for photographing light emission of Comparative Example 4.
Figure 18:
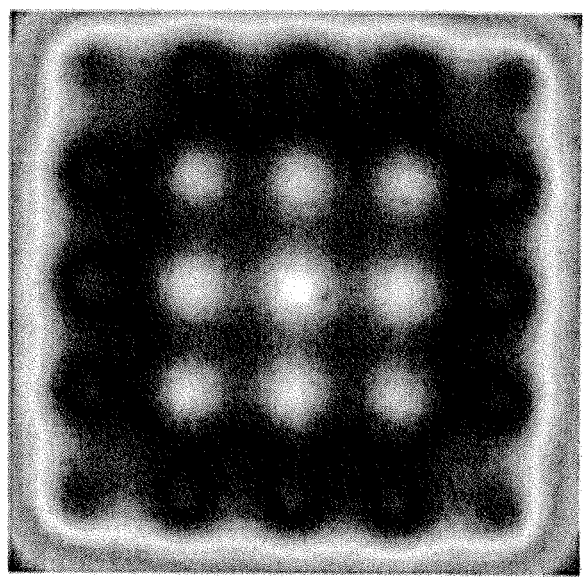
FIG. 18 shows an image processing view for photographing light emission of Comparative Example 5.
Figure 19:
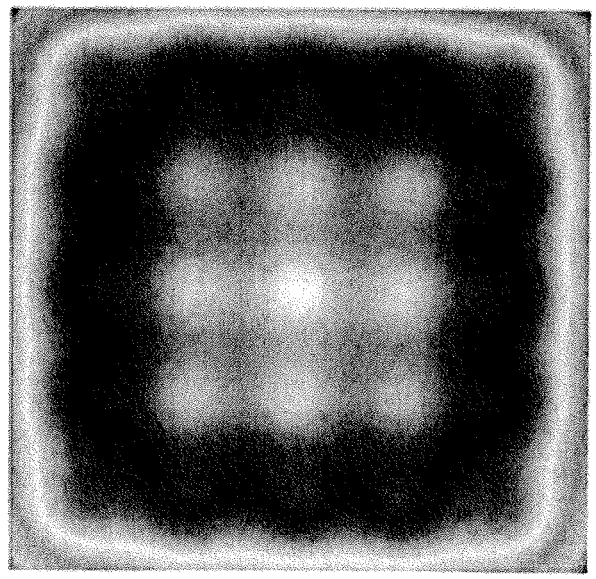
FIG. 19 shows an image processing view for photographing light emission of Comparative Example 6.
Figure 20:
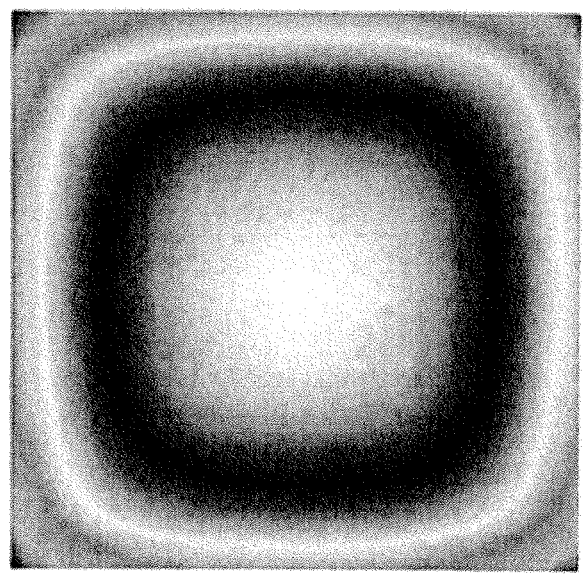
FIG. 20 shows an image processing view for photographing light emission of Comparative Example 7.

In Comparative Examples 2 and 3, the spacer layer was not provided, so that each of the evaluations of the brightness uniformity was defective, which was below 70%, and as shown in FIGS. 15 and 16, the light emitting diode elements served as a point light source.

Furthermore, in Comparative Examples 4 to 7, after the light emitting diode elements were encapsulated by the encapsulating layer, the light scattering layer corresponding to the light emitting diode elements was put, so that the light emitting diode device was produced. In this way, the number of the production steps became large.

(3) Light Transmittance (Spacer Layer and Phosphor Layer)

A. Spacer Layer

A sample of the spacer layer having a thickness of 500 μm was fabricated from the thermosetting silicone resin composition used in (2) Formation of Spacer Layer in Example 1. The light transmittance of the fabricated sample with respect to the light in the wavelength of 555 nm was measured with a spectrophotometer (manufactured by JASCO Corporation). As a result, the light transmittance was 93%.

B. Phosphor Layer

A sample of the phosphor layer having a thickness of 500 μm was fabricated from the phosphor containing resin composition used in (3) Formation of Phosphor Layer in Example 1. The light transmittance of the fabricated sample with respect to the light in the wavelength of 555 nm was measured with a spectrophotometer (manufactured by JASCO Corporation). As a result, the light transmittance was 60%.

(4) Refractive Index (Spacer Layer)

A sample of the spacer layer having a thickness of 500 μm was fabricated from the thermosetting silicone resin composition used in (2) Formation of Spacer Layer in Example 1. The refractive index of the fabricated sample with respect to the light in the wavelength of 555 nm was measured with an Abbe's refractometer. As a result, the refractive index was 1.41.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. An encapsulating sheet comprising:
   an encapsulating layer for encapsulating a light emitting diode element,
   a light scattering layer formed at one side in a thickness direction of the encapsulating layer and for scattering light emitted from the light emitting diode element, and
   a spacer layer interposed between the encapsulating layer and the light scattering layer,
   wherein the encapsulating sheet is a part for producing a light emitting diode device, the part before encapsulating the light emitting diode mounted on a board.

2. The encapsulating sheet according to claim 1, wherein the thickness of the spacer layer is 0.5 mm or more.

3. The encapsulating sheet according to claim 1, wherein the spacer layer is formed from a transparent resin.

4. The encapsulating sheet according to claim 1, wherein the encapsulating layer is formed from a thermosetting resin in a B-stage state.

5. The encapsulating sheet according to claim 1, wherein the light scattering layer is formed from a light scattering resin containing a silicone resin and a light reflecting component dispersed in the silicone resin.

6. The encapsulating sheet according to claim 1, wherein the encapsulating sheet further includes a phosphor layer for converting a wavelength of the light emitted from the light emitting diode element.

7. The encapsulating sheet according to claim 6, wherein the phosphor layer is interposed between the encapsulating layer and the spacer layer.

8. The encapsulating sheet according to claim 7, wherein
   the phosphor layer is formed on an upper surface of the encapsulating layer,
   the spacer layer is formed on an upper surface of the phosphor layer, and
   the light scattering layer is formed on an upper surface of the spacer layer.

9. The encapsulating sheet according to claim 8, wherein a release film is further laminated on an upper surface of the light scattering layer.

10. The encapsulating sheet according to claim 9, which consists of the encapsulating layer, the phosphor layer, the spacer layer, the light scattering layer, and the release film.

11. The encapsulating sheet according to claim 1, further comprising a release film formed at one side in a thickness direction of the spacer layer.

12. The encapsulating sheet according to claim 1, wherein the spacer layer is formed on an upper surface of the encapsulating layer, and the light scattering layer is formed on an upper surface of the spacer layer.

13. The encapsulating sheet according to claim 12, wherein a release film is further laminated on the upper surface of the light scattering layer.

14. The encapsulating sheet according to claim 13, which consists of the encapsulating layer, the spacer layer, the light scattering layer, and the release film.

15. A method for producing an encapsulating sheet comprising the steps of:
   preparing a release film,
   forming, on an upper surface of the release film, a light scattering layer for scattering light emitted from a light emitting diode element,
   forming a spacer layer on an upper surface of the light scattering layer, and forming an encapsulating layer for encapsulating the light emitting diode element on an upper surface of the spacer layer.

16. A light emitting diode device comprising:
a board,
a light emitting diode element mounted on the board, and
an encapsulating sheet formed on the board so as to encapsulate the light emitting diode element, wherein
the encapsulating sheet comprises:
an encapsulating layer for encapsulating the light emitting diode element,
a spacer layer formed on an upper surface of the encapsulating layer, and
a light scattering layer formed on an upper surface of the spacer layer and for scattering light emitted from the light emitting diode element.

17. The light emitting diode device according claim 16, wherein a plurality of the light emitting diode elements are provided at spaced intervals to each other in a direction perpendicular to the thickness direction of the encapsulating sheet.

18. A method for producing a light emitting diode device comprising the steps of:
preparing a board mounted with a light emitting diode element and disposing an encapsulating sheet at one side in a thickness direction of the board to encapsulate the light emitting diode element by an encapsulating layer, wherein
the encapsulating sheet comprises:
an encapsulating layer for encapsulating the light emitting diode element,
a light scattering layer formed at one side in a thickness direction of the encapsulating layer and for scattering light emitted from the light emitting diode element, and
a spacer layer interposed between the encapsulating layer and the light scattering layer,
wherein the encapsulating sheet is a part for producing a light emitting diode device, the part before encapsulating the light emitting diode mounted on a board, and
in the step of encapsulating the light emitting diode element by the encapsulating layer, putting of the encapsulating layer and putting of the light scattering layer with respect to the board are performed at the same time.

19. A method for producing an encapsulating sheet, comprising the steps of:
preparing a release film,
forming, on an upper surface of the release film, a light scattering layer for scattering light emitted from the light emitting diode element,
forming a spacer layer on an upper surface of the light scattering layer,
forming, on an upper surface of the spacer layer, a phosphor layer for converting a wavelength of the light emitting from the light emitting diode element, and
forming an encapsulating layer for encapsulating the light emitting diode element on an upper surface of the spacer layer.

20. A light emitting diode device comprising:
a board,
a light emitting diode element mounted on the board, and
an encapsulating sheet formed on the board so as to encapsulate the light emitting diode element, the encapsulating sheet including:
an encapsulating layer for encapsulating the light emitting diode element,
a phosphor layer formed on an upper surface of the encapsulating layer and for converting a wavelength of light emitted from the light emitting diode element,
a spacer layer formed on an upper surface of the phosphor layer, and
a light scattering layer formed on an upper surface of the spacer layer and for scattering light emitting from the light emitting diode element.

\* \* \* \* \*